US011094746B2

(12) United States Patent
Nozawa

(10) Patent No.: US 11,094,746 B2
(45) Date of Patent: *Aug. 17, 2021

(54) IMAGING DEVICE

(71) Applicant: Panasonic Intellectual Property Management Co., Ltd., Osaka (JP)

(72) Inventor: Katsuya Nozawa, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/831,231

(22) Filed: Mar. 26, 2020

(65) Prior Publication Data

US 2020/0227483 A1     Jul. 16, 2020

Related U.S. Application Data

(63) Continuation of application No. 15/729,739, filed on Oct. 11, 2017, now Pat. No. 10,672,836, which is a
(Continued)

(30) Foreign Application Priority Data

| Jul. 8, 2015 | (JP) | JP2015-137063 |
| Jul. 8, 2015 | (JP) | JP2015-137064 |
| Apr. 18, 2016 | (JP) | JP2016-082890 |

(51) Int. Cl.
*H01L 27/30* (2006.01)
*H01L 27/146* (2006.01)
(Continued)

(52) U.S. Cl.
CPC .......... *H01L 27/307* (2013.01); *H01L 27/146* (2013.01); *H01L 31/10* (2013.01);
(Continued)

(58) Field of Classification Search
None
See application file for complete search history.

(56) References Cited

U.S. PATENT DOCUMENTS

| 2007/0063156 A1 | 3/2007 | Hayashi |
| 2009/0001362 A1 | 1/2009 | Toguchi et al. |

(Continued)

FOREIGN PATENT DOCUMENTS

| CN | 102057500 A | 5/2011 |
| CN | 102196195 A | 9/2011 |

(Continued)

OTHER PUBLICATIONS

Non-Final Office Action dated Apr. 6, 2018 in U.S. Appl. No. 15/729,739.

(Continued)

*Primary Examiner* — Nicholas J Tobergte
*Assistant Examiner* — Kien C Ly
(74) *Attorney, Agent, or Firm* — McDermott Will & Emery LLP

(57) ABSTRACT

An imaging device includes: pixels arranged one-dimensionally or two-dimensionally, each of the pixels including an electrode that is electrically connected to the other pixels, a charge capturing unit that is separated from the other pixels, and a photoelectric conversion layer that is located between the electrode and the charge capturing unit, the photoelectric conversion layer being continuous among the pixels. The photoelectric conversion layer contains semiconductor carbon nanotubes, and one of a first substance and a second substance, the first substance having an electron affinity larger than that of the semiconducting carbon nanotubes, the second substance having a ionization energy smaller than that of the semiconductor carbon nanotubes.

27 Claims, 10 Drawing Sheets

Related U.S. Application Data continuation of application No. PCT/JP2016/002917, filed on Jun. 17, 2016.

(51) Int. Cl.
*H01L 31/10* (2006.01)
*H01L 51/00* (2006.01)
*H01L 51/42* (2006.01)

(52) U.S. Cl.
CPC ...... *H01L 51/0048* (2013.01); *H01L 51/4273* (2013.01); *H01L 51/0046* (2013.01); *H01L 51/4253* (2013.01)

(56) References Cited

U.S. PATENT DOCUMENTS

| | | |
|---|---|---|
| 2009/0057659 A1 | 3/2009 | Maehara et al. |
| 2009/0253590 A1 | 10/2009 | Murakoshi et al. |
| 2009/0267060 A1 | 10/2009 | Forrest et al. |
| 2010/0313944 A1 | 12/2010 | Curran et al. |
| 2011/0216212 A1 | 9/2011 | Watanabe et al. |
| 2011/0220191 A1* | 9/2011 | Flood ............... B82Y 30/00 136/255 |
| 2012/0007046 A1 | 1/2012 | Dissanayake et al. |
| 2012/0186635 A1 | 7/2012 | Eastman et al. |
| 2013/0048865 A1 | 2/2013 | Nishino et al. |
| 2013/0064750 A1 | 3/2013 | Zettl |
| 2013/0082234 A1* | 4/2013 | Bao ............... H01L 51/444 257/9 |
| 2014/0054442 A1 | 2/2014 | Huang et al. |
| 2014/0339665 A1 | 11/2014 | Tani |
| 2015/0014627 A1* | 1/2015 | Yu ............... H01L 31/046 257/13 |
| 2016/0064456 A1 | 3/2016 | Lee et al. |
| 2016/0132296 A1 | 5/2016 | Park |
| 2017/0096339 A1 | 4/2017 | He et al. |
| 2017/0299601 A1* | 10/2017 | Gomez ............... B82Y 15/00 |

FOREIGN PATENT DOCUMENTS

| | | |
|---|---|---|
| JP | 2003234460 | 8/2003 |
| JP | 2007-088033 A | 4/2007 |
| JP | 2008-218445 | 9/2008 |
| JP | 2011-520262 | 7/2011 |
| JP | 2013-156463 | 5/2013 |
| WO | 2006/121155 A1 | 11/2006 |
| WO | 2007-074339 | 7/2007 |
| WO | 2009-139060 | 11/2009 |

OTHER PUBLICATIONS

Final Office Action dated Nov. 2, 2018 in U.S. Appl. No. 15/729,739.
Advisory Action dated Apr. 3, 2019 in U.S. Appl. No. 15/729,739.
Non-Final Office Action dated Jul. 26, 2019 in U.S. Appl. No. 15/729,739.
Notice of Allowance dated Jan. 28, 2020 in U.S. Appl. No. 15/729,739.
Extended European Serach Report dated May 29, 2018 in related European Patent Application No. 16821000.3.
International Search Report dated Aug. 30, 2016 in International Application No. PCT/JP2016/002917.
English Translation of Chinese Search Report dated Apr. 6, 2021 for the related Chinese Patent Application No. 201680007083.4.

* cited by examiner

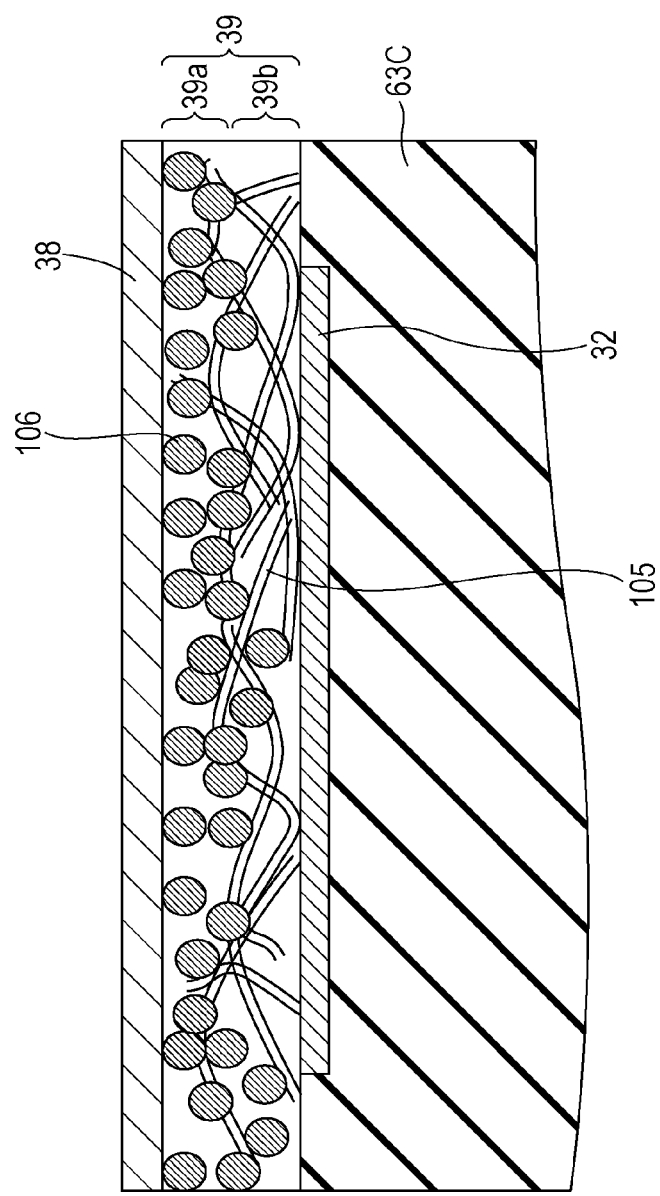

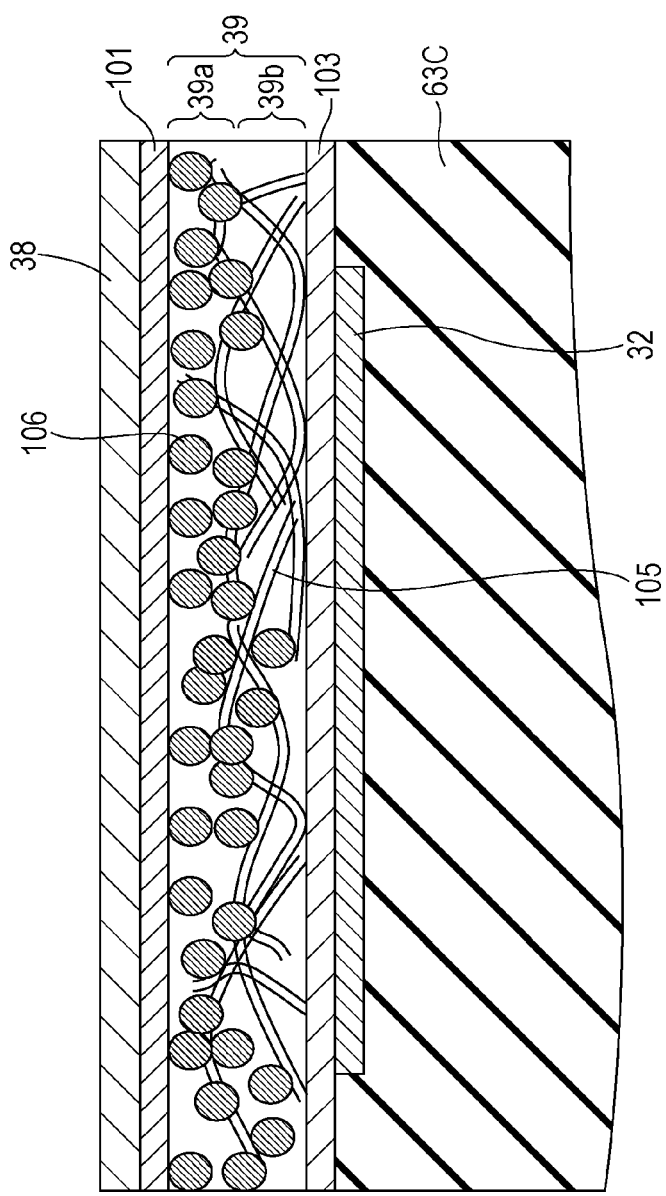

IMAGING DEVICE

This is a Continuation of application Ser. No. 15/729,739, filed Oct. 11, 2017, which is a Bypass Continuation of International Application PCT/JP2016/002917, filed Jun. 17, 2016, which claims priority to Japanese Patent Application No. 2015-137063, filed on Jul. 8, 2015; Japanese Patent Application No. 2015-137064, filed on Jul. 8, 2015; and Japanese Patent Application No. 2016-082890, filed on Apr. 18, 2016, the entire disclosures of which are hereby incorporated herein by reference.

BACKGROUND

1. Technical Field

The present disclosure relates to a stacked imaging device.

2. Description of the Related Art

In recent years, stacked image sensors in which photoelectric conversion elements are provided on semiconductor substrates have been realized. In stacked image sensors, photoelectric conversion layers in the photoelectric conversion elements can be formed of materials that are different from the materials of the semiconductor substrates. Thus, the photoelectric conversion layers can be formed of inorganic materials or organic materials that are different from semiconductor materials of the related art, such as silicon, and image sensors having physical properties or functions that are different from those of image sensors of the related art, such as sensitivity to a wavelength band that is different from the wavelength band of the related art, can be realized. For example, Japanese Unexamined Patent Application Publication No. 2003-234460 discloses an image sensor including photoelectric conversion layers that have sensitivity to two or more different wavelength bands, thereby having high light utilization efficiency.

SUMMARY

One non-limiting and exemplary embodiment provides a novel stacked imaging device.

In one general aspect, the techniques disclosed here feature an imaging device including: pixels arranged one-dimensionally or two-dimensionally, each of the pixels including an electrode that is electrically connected to the other pixels, a charge capturing unit that is separated from the other pixels, and a photoelectric conversion layer that is located between the electrode and the charge capturing unit, the photoelectric conversion layer being continuous among the pixels, wherein the photoelectric conversion layer contains semiconductor carbon nanotubes, and one of a first substance and a second substance, the first substance having an electron affinity larger than that of the semiconducting carbon nanotubes, the second substance having a ionization energy smaller than that of the semiconductor carbon nanotubes.

According to an aspect of the present disclosure, an imaging device including carbon nanotubes as a photoelectric conversion material is provided.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3A schematically illustrates a cross-section of an example of the configuration of a photoelectric conversion unit of the imaging device illustrated in FIG. 1;

FIG. 3B schematically illustrates a cross-section of another example of the configuration of the photoelectric conversion unit of the imaging device illustrated in FIG. 1;

DETAILED DESCRIPTION

Figure 1:
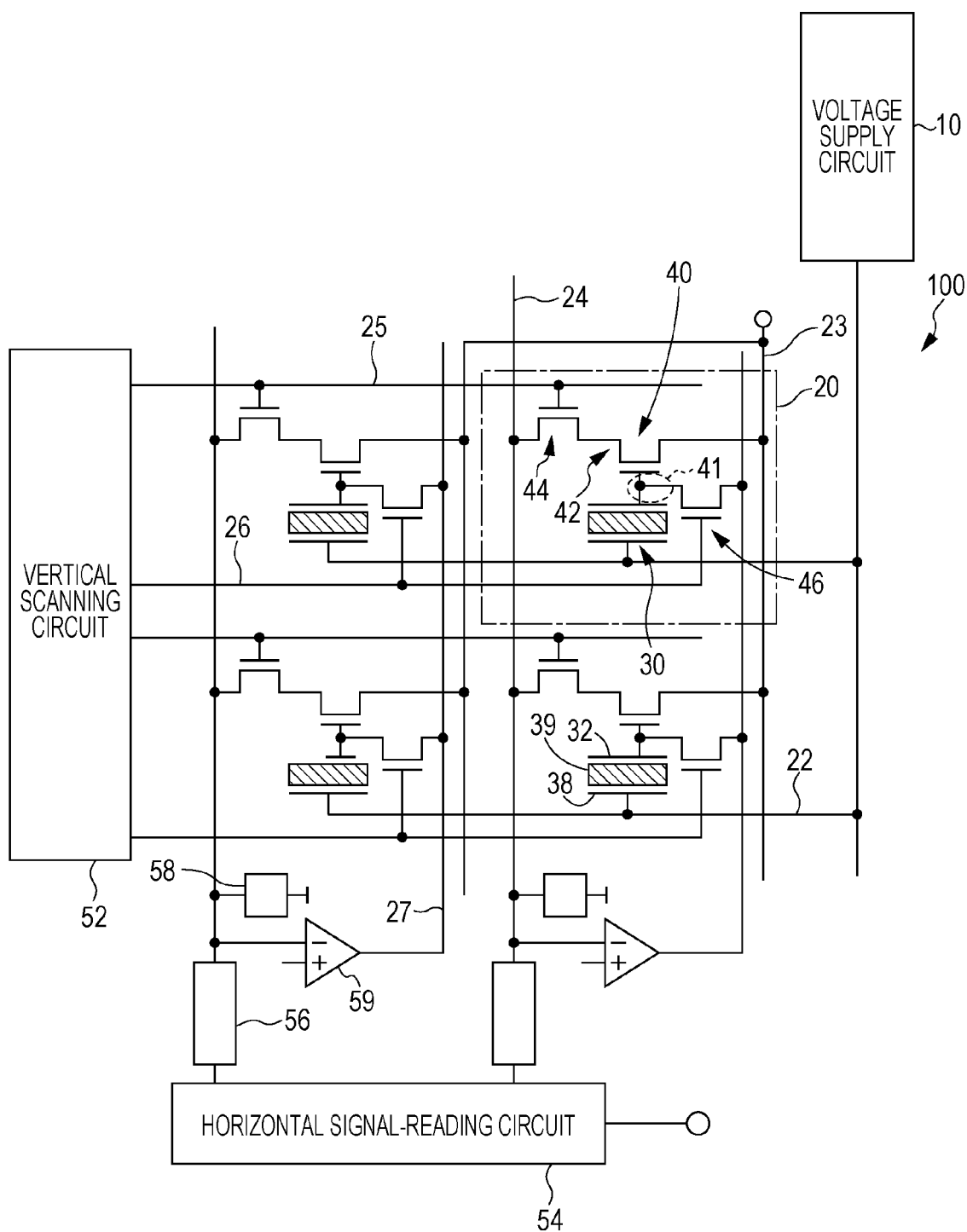
FIG. 1 illustrates an example of a circuit of an imaging device according to a first embodiment of the present disclosure.

There is a demand for imaging devices having sensitivity to the near-infrared region to be used for in-vehicle cameras, monitoring cameras, and the like. Therefore, it is considered that organic semiconductor materials having sensitivity to the near-infrared region are used as photoelectric conversion materials for photoelectric conversion elements. The inventors have focused on carbon nanotubes as a material that absorbs light in the near-infrared region.

Molecules of carbon nanotubes typically have a tubular shape with a length of about several tens of nanometers to several millimeters and have unique characteristics that are not seen in a variety of organic materials and inorganic materials of the related art. In particular, it is known that the electron and hole mobility of carbon nanotubes is extremely high.

By using such characteristics of carbon nanotubes, the inventors have arrived at a novel imaging device that enables high-speed operation. An overview of an aspect of the present disclosure is as follows.

Item 1

An imaging device comprising: pixels arranged one-dimensionally or two-dimensionally, each of the pixels including an electrode that is electrically connected to the other pixels, a charge capturing unit that is separated from the other pixels, and a photoelectric conversion layer that is located between the electrode and the charge capturing unit, the photoelectric conversion layer being continuous among the pixels, wherein the photoelectric conversion layer contains semiconductor carbon nanotubes, and one of a first substance and a second substance, the first substance having an electron affinity larger than that of the semiconducting carbon nanotubes, the second substance having a ionization energy smaller than that of the semiconductor carbon nanotubes. According to this configuration, an imaging device containing carbon nanotubes as a photoelectric conversion material is realized. By containing the substance having a larger electron affinity than the semiconducting carbon nanotubes or the substance having a smaller ionization energy than the semiconducting carbon nanotubes, the imaging device can suppress mixing of detected charges among pixels and can acquire high-definition images or can have a minute pixel size.

Item 2

The imaging device according to Item 1, wherein the photoelectric conversion layer contains the first substance, and the charge capturing unit captures negative charges. According to this configuration, the negative charges can be detected as signal charges.

Item 3

The imaging device according to Item 1, wherein the photoelectric conversion layer contains the second substance, and the charge capturing unit captures positive charges. According to this configuration, the positive charges can be detected as signal charges.

Item 4

The imaging device according to any of Items 1 to 3, further comprising: a semiconductor substrate that supports the photoelectric conversion layer, wherein each of the pixels is provided on the semiconductor substrate and further includes a charge detecting transistor that is electrically connected to the charge capturing unit. According to this configuration, a stacked imaging device can be realized.

Item 5

The imaging device according to any of Items 1 to 4, wherein the semiconductor carbon nanotubes and the one of the first substance and the second substance are dispersed to each other in the photoelectric conversion layer. According to this configuration, the mixing of charges among pixels can be more reliably suppressed.

Item 6

The imaging device according to Item 4, wherein the charge capturing unit is an impurity diffusion region in the semiconductor substrate.

Item 7

The imaging device according to Item 4, wherein the charge capturing unit is an electrode located above the semiconductor substrate.

Item 8

The imaging device according to Item 2, wherein the first substance is a molecule having a fullerene skeleton According to this configuration, the negative charges can be detected as signal charges.

Item 9

The imaging device according to Item 3, further comprising a voltage supply circuit that is electrically connected to the electrode and that generates a bias voltage that is set in such a manner that the potential of the charge capturing unit is higher than the potential of the electrode.

Item 10

The imaging device according to Item 2, further comprising a voltage supply circuit that is electrically connected to the electrode and that generates a bias voltage that is set in such a manner that the potential of the charge capturing unit is lower than the potential of the electrode.

Item 11

An imaging device comprising a plurality of pixels that are arrayed one-dimensionally or two-dimensionally. Each of the pixels includes an electrode that is electrically connected to other pixels, a charge capturing unit that is separated from the other pixels, and a photoelectric conversion layer that is located between the electrode and the charge capturing unit and that contains a semiconducting carbon nanotubes and one of a first substance and a second substance, the first substance having a larger electron affinity than the semiconducting carbon nanotubes, the second substance having a smaller ionization energy than the semiconducting carbon nanotubes, wherein at least some of the semiconducting carbon nanotubes are electrically connected to the charge capturing unit. This configuration contains semiconducting carbon nanotubes having high carrier mobility, and charges that move through the semiconducting carbon nanotubes are captured by the electrode. Accordingly, the imaging device can capture images with a high-speed operation and at a high frame rate.

Item 12

The imaging device according to Item 11, wherein the photoelectric conversion layer contains the first substance, and the charge capturing unit captures positive charges. According to this configuration, the positive charges can be detected as signal charges.

Item 13

The imaging device according to Item 11, wherein the photoelectric conversion layer contains the second substance, and the charge capturing unit captures negative charges. According to this configuration, the negative charges can be detected as signal charges.

Item 14

The imaging device according to any of Items 11 to 13, further comprising a semiconductor substrate that supports the photoelectric conversion layer, wherein each of the pixels is provided on the semiconductor substrate and further includes a charge detecting transistor that is electrically connected to the charge capturing unit. According to this configuration, a stacked imaging device can be realized.

Item 15

The imaging device according to Item 14, wherein the charge capturing unit is an impurity diffused region that is formed in the semiconductor substrate.

Item 16

The imaging device according to Item 14, wherein the charge capturing unit is an electrode that is located on the semiconductor substrate.

Item 17

The imaging device according to Item 12, wherein the first substance is a molecule having a fullerene skeleton. According to this configuration, the positive charges can be detected as signal charges.

Item 18

The imaging device according to Item 12, further comprising a voltage supply circuit that is electrically connected to the electrode and that generates a bias voltage that is set in such a manner that the potential of the charge capturing unit is lower than the potential of the electrode.

Item 19

The imaging device according to Item 13, further comprising a voltage supply circuit that is electrically connected to the electrode and that generates a bias voltage that is set in such a manner that the potential of the charge capturing unit is higher than the potential of the electrode.

Embodiments of the present disclosure will be described below in detail. The following embodiments are general or specific examples. Values, shapes, materials, components, arrangements and connection modes of the components, steps, order of the steps, and the like described in the following embodiments are examples and do not limit the present disclosure. Various aspects described herein may be combined with one another insofar as the combinations do not cause contradictions. In addition, among the components described in the following embodiments, components that are not described in independent claims, which define broadest concepts, are described as arbitrary components. In the following description, components having substantially the same functions are given the same reference numerals, and redundant description thereof might be omitted.

First Embodiment

1. General Configuration of Imaging Device

An overview of the configuration of an imaging device according to the present disclosure will be described with reference to FIG. 1. FIG. 1 illustrates an example of a circuit configuration of an imaging device according to an embodiment of the present disclosure. An imaging device 100 illustrated in FIG. 1 includes a plurality of unit pixel cells 20 and a peripheral circuit. The peripheral circuit includes a voltage supply circuit 10 that supplies a predetermined voltage to each of the unit pixel cells 20.

The unit pixel cells 20 are arranged one-dimensionally or two-dimensionally on a semiconductor substrate, thereby forming a photosensitive region (pixel region). In the configuration illustrated in FIG. 1, the unit pixel cells 20 are arrayed along a row direction and a column direction. The row direction and the column direction herein respectively mean the direction in which rows extend and the direction in which columns extend. That is, the perpendicular direction on FIG. 1 is the column direction, and the horizontal direction is the row direction. In FIG. 1, four unit pixel cells 20 that are arranged in a 2×2 matrix are illustrated. The number of unit pixel cells 20 illustrated in FIG. 1 is merely an example for description, and the number of unit pixel cells 20 is not limited to four. If the unit pixel cells 20 are arranged one-dimensionally, the imaging device 100 is a line sensor.

Each of the unit pixel cells 20 includes a photoelectric conversion unit 30 and a signal detection circuit 40 that detects signals generated by the photoelectric conversion unit 30. The photoelectric conversion unit 30 includes a pixel electrode (charge capturing unit) 32, a counter electrode 38, and a photoelectric conversion layer 39 disposed between the pixel electrode 32 and the counter electrode 38. As in the illustration, the counter electrode (electrode) 38 is connected to the voltage supply circuit 10 via a storage control line 22. At the time of the operation of the imaging device 100, a predetermined bias voltage is applied to the counter electrode 38 through the storage control line 22.

As will be described later in detail, the photoelectric conversion layer 39 contains semiconducting carbon nanotubes and is configured in such a manner that the pixel electrode 32 captures either holes (positive charges) or electrons (negative charges) as signal charges among hole-electron pairs generated through photoelectric conversion. The potential of the counter electrode 38 is controlled by using the bias voltage generated by the voltage supply circuit 10, and thereby either holes or electrons can be captured by the pixel electrode 32. For example, in a case of using holes as signal charges, in order to set the potential of the counter electrode 38 higher than the potential of the pixel electrode 32, a voltage of about 10 V, for example, is applied to the storage control line 22.

In the configuration illustrated in FIG. 1, the signal detection circuit 40 includes an amplifier transistor (charge detecting transistor) 42, an address transistor (row selecting transistor) 44, and a reset transistor 46. Typically, the amplifier transistor 42 and the address transistor 44 are field-effect transistors (FETs) formed on a semiconductor substrate. Unless otherwise specified, an example of using n-channel MOS transistors will be described below. Note that the "semiconductor substrate" herein is not limited to a substrate that is entirely formed of a semiconductor, but may be an insulating substrate, for example, having a semiconductor layer on a surface on which a photosensitive region is formed. Examples of the semiconductor substrate include a p-type silicon substrate.

As in the illustration, one (typically, a source) of an input terminal and an output terminal of the amplifier transistor 42 is connected to one (typically, a drain) of an input terminal and an output terminal of the address transistor 44. A control terminal (gate) of the amplifier transistor 42 is electrically connected to the pixel electrode 32 of the photoelectric conversion unit 30. Signal charges (e.g., holes) collected by the pixel electrode 32 are stored in a charge storing node (also referred to as "floating diffusion node") 41 between the pixel electrode 32 and the gate of the amplifier transistor 42.

A voltage in accordance with the signal charges stored at the charge storing node 41 is applied to the gate of the amplifier transistor 42. The amplifier transistor 42 amplifies this voltage. That is, the amplifier transistor 42 amplifies the signal generated by the photoelectric conversion unit 30. The voltage amplified by the amplifier transistor 42 is selectively read as a signal voltage through the address transistor 44.

One of the source and the drain of the reset transistor 46 is connected to the charge storing node 41 and is electrically connected to the pixel electrode 32.

The reset transistor 46 resets the signal charges stored at the charge storing node 41. In other words, the reset transistor 46 resets the potential of the gate of the amplifier transistor 42 and the potential of the pixel electrode 32.

As in the illustration, the imaging device 100 includes a power source line 23, vertical signal lines 24, address signal lines 25, and reset signal lines 26. These lines are connected to each of the unit pixel cells 20. The power source line (source-follower power source) 23 is connected to one of the source and the drain of the amplifier transistor 42 and supplies a predetermined power source voltage to each of the unit pixel cells 20. Of the source and the drain of the address transistor 44, a vertical signal line 24 is connected to either one that is not connected to the source or the drain of the amplifier transistor 42. An address signal line 25 is connected to the gate electrode of the address transistor 44. A reset signal line 26 is connected to the gate of the reset transistor 46.

The peripheral circuit of the imaging device 100 includes a vertical scanning circuit (also referred to as "row scanning circuit") 52, a horizontal signal-reading circuit (also referred to as "column scanning circuit") 54, a plurality of column signal processing circuits (also referred to as "row signal storing circuits") 56, a plurality of load circuits 58, and a plurality of inverting amplifiers 59. The column signal processing circuits 56, the load circuits 58, and the inverting amplifiers 59 are provided to correspond to the respective columns of the plurality of unit pixel cells 20 arrayed in the row direction and the column direction. Each of the column signal processing circuits 56 is electrically connected to unit pixel cells 20 arranged in a corresponding column via a vertical signal line 24 corresponding to each column of the plurality of unit pixel cells 20. The plurality of column signal processing circuits 56 are electrically connected to the horizontal signal-scanning circuit 54. Each of the load circuits 58 is electrically connected to a corresponding one of the vertical signal lines 24, and the load circuits 58 and the amplifier transistors 42 form source-follower circuits.

The vertical scanning circuit 52 is connected to the address signal lines 25 and the reset signal lines 26. The vertical scanning circuit 52 applies a row selection signal for controlling ON and OFF of the address transistors 44 to the gates of the address transistors 44 through the address signal lines 25. By the row selection signal being sent through a corresponding one of the address signal lines 25, a reading target row is scanned and selected. A signal voltage is read from unit pixel cells 20 in the selected row to a corresponding one of the vertical signal lines 24. In addition, the vertical scanning circuit 52 applies a reset signal for controlling ON and OFF of the reset transistors 46 to the gates of the reset transistors 46 through the reset signal lines 26. By the row selection signal being sent through a corresponding one of the reset signal lines 26, a reset-operation target row of the unit pixel cells 20 is selected. In this manner, the vertical scanning circuit 52 selects a plurality of unit pixel cells 20 in units of row and reads the signal voltage and resets the potentials of the pixel electrodes 32.

The signal voltage read from the unit pixel cells 20 selected by the vertical scanning circuit 52 is transferred to a column signal processing circuit 56 through a vertical signal line 24. The column signal processing circuit 56 perform noise-cancel signal processing typified by correlated double sampling, analog-digital conversion (AD conversion), and the like. The horizontal signal-scanning circuit 54 reads signals sequentially from the plurality of column signal processing circuits 56 to a horizontal common signal line (not illustrated).

Note that the vertical scanning circuit 52 may partly include the above-described voltage supply circuit 10. Alternatively, the voltage supply circuit 10 may be electrically connected to the vertical scanning circuit 52. In other words, a bias voltage may be applied to the counter electrodes 38 through the vertical scanning circuit 52.

In the configuration illustrated in FIG. 1, the plurality of inverting amplifiers 59 are provided to correspond to the respective columns. A negative input terminal of each of the inverting amplifiers 59 is connected to a corresponding one of the vertical signal lines 24. An output terminal of each of the inverting amplifiers 59 is connected to unit pixel cells 20 in a corresponding column via a feedback line 27 provided to correspond to each column.

As in the illustration, of the source and the drain of each reset transistor 46, the feedback line 27 is connected to either one (drain) that is not connected to the charge storing node 41. Thus, while an address transistor 44 and a reset transistor 46 are in a conductive state, the negative terminal of the inverting amplifier 59 receives the output of the address transistor 44. On the other hand, a reference voltage used for resetting is applied to a positive input terminal of the inverting amplifier 59 from a power source, which is not illustrated. The inverting amplifier 59 performs a feedback operation so that the gate voltage of the amplifier transistor 42 is set at a predetermined feedback voltage. The feedback voltage is the output voltage of the inverting amplifier 59. The output voltage of the inverting amplifier 59 is, for example, 0 V or a positive voltage around 0 V. The inverting amplifier 59 may also be referred to as a "feedback amplifier".

2. Device Configuration of Imaging Device

Figure 2:
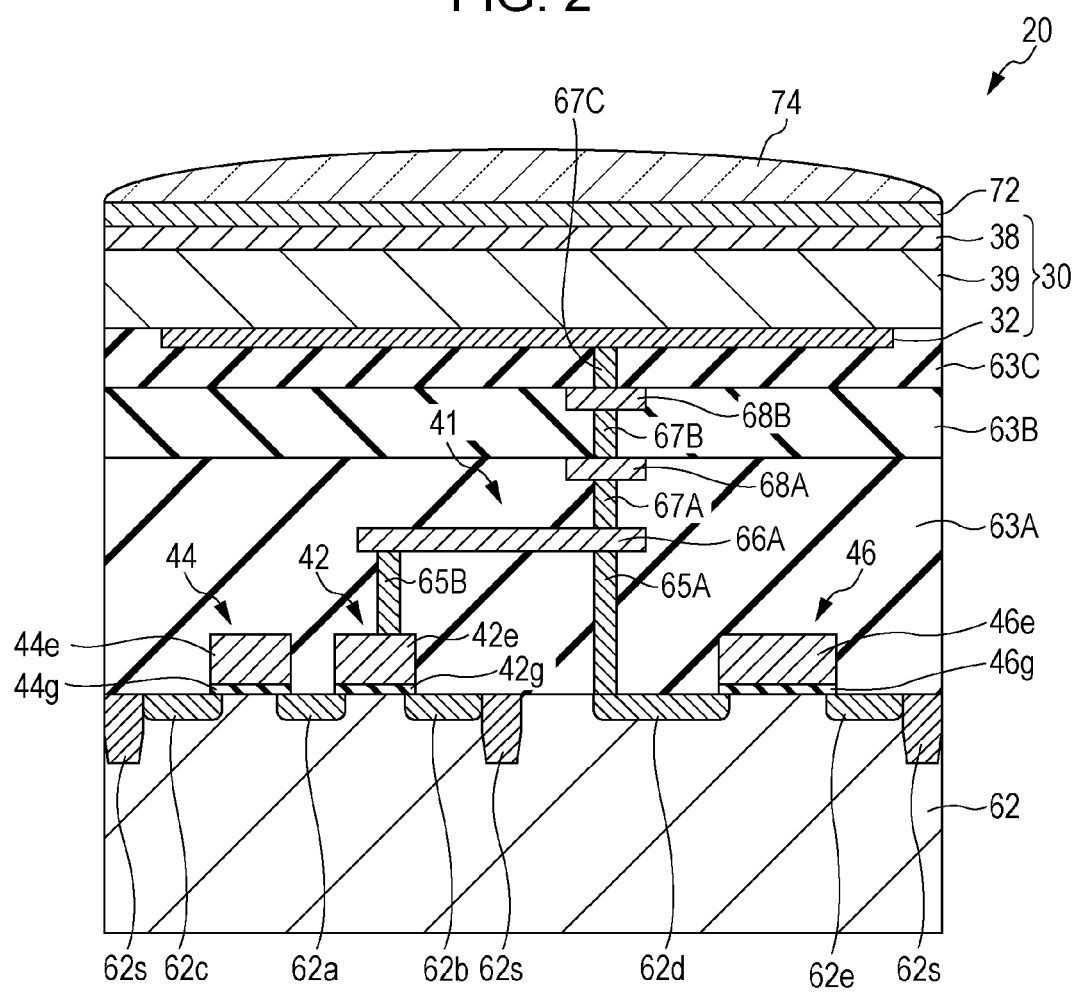
FIG. 2 schematically illustrates a cross-section of an example of a device configuration in each unit pixel cell of the imaging device illustrated in FIG. 1.

FIG. 2 schematically illustrates a cross-section of a device configuration of each unit pixel cell 20 of the imaging device 100 according to the first embodiment of the present disclosure. In the configuration illustrated in FIG. 2, the unit pixel cell 20 includes a semiconductor substrate 62 (e.g., a silicon substrate) that supports the photoelectric conversion unit 30. As in the illustration, the photoelectric conversion unit 30 is disposed above the semiconductor substrate 62. In this example, interlayer insulating layers 63A, 63B, and 63C are stacked on the semiconductor substrate 62, and a stack of the pixel electrode 32, the photoelectric conversion layer 39, and the counter electrode 38 is disposed on the interlayer insulating layer 63C. The pixel electrode 32 is divided for each pixel, and the pixel electrodes 32 are formed to be spatially separate per two adjacent unit pixel cells 20, and thereby two adjacent pixel electrodes 32 are electrically separated from each other. In addition, the photoelectric conversion layer 39 and the counter electrode 38 are formed to extend over a plurality of unit pixel cells 20. The counter electrode 38 is formed of, for example, a metal oxide such as ITO or ZnO, few-layer graphene, a metal nanowire, or the like.

The amplifier transistor 42, the address transistor 44, and the reset transistor 46 are formed on the semiconductor substrate 62.

The amplifier transistor 42 includes impurity regions 62a and 62b formed in the semiconductor substrate 62, a gate insulating layer 42g located on the semiconductor substrate 62, and a gate electrode 42e located on the gate insulating layer 42g. The impurity regions (n-type impurity regions) 62a and 62b serve as the drain and the source of the amplifier transistor 42.

The address transistor 44 includes impurity regions 62a and 62c formed in the semiconductor substrate 62, a gate insulating layer 44g located on the semiconductor substrate 62, and a gate electrode 44e located on the gate insulating layer 44g. The impurity regions (n-type impurity regions) 62a and 62c serve as the drain and the source of the address transistor 44. In this example, by sharing the impurity region 62a between the amplifier transistor 42 and the address transistor 44, the source (or the drain) of the amplifier transistor 42 is electrically connected to the drain (or the source) of the address transistor 44.

The reset transistor 46 includes impurity regions 62d and 62e formed in the semiconductor substrate 62, a gate insulating layer 46g located on the semiconductor substrate 62, and a gate electrode 46e located on the gate insulating layer 46g. The impurity regions (n-type impurity regions) 62d and 62e serve as the drain and the source of the reset transistor 46.

In the semiconductor substrate 62, element separation regions 62s are provided between adjacent unit pixel cells 20 and between the amplifier transistor 42 and the reset transistor 46. The adjacent unit pixel cells 20 are electrically separated from each other by the element separation regions 62s. In addition, by the element separation regions 62s being provided between the adjacent unit pixel cells 20, leakage of signal charges stored at the charge storing node 41 is suppressed.

In the interlayer insulating layer 63A, a contact plug 65A connected to the impurity region 62d of the reset transistor 46, a contact plug 65B connected to the gate electrode 42e of the amplifier transistor 42, and a wiring 66A connecting the contact plug 65A and the contact plug 65B to each other are formed. Thus, the n-type impurity region 62d (e.g., the drain) of the reset transistor 46 is electrically connected to the gate electrode 42e of the amplifier transistor 42. In the configuration illustrated in FIG. 2, a plug 67A and a wiring 68A are further formed in the interlayer insulating layer 63A. In addition, a plug 67B and a wiring 68B are formed in the interlayer insulating layer 63B, and a plug 67C is formed in the interlayer insulating layer 63C. Thus, the wiring 66A is electrically connected to the pixel electrode 32. The contact plug 65A, the contact plug 65B, the wiring 66A, the plug 67A, the wiring 68A, the plug 67B, the wiring 68B, and the plug 67C are typically formed of metals.

In the configuration illustrated in FIG. 2, a protective layer 72 is provided on the counter electrode 38. The protective layer 72 is not a substrate disposed to support the photoelectric conversion unit 30. As illustrated in FIG. 2, microlenses may be disposed on the protective layer 72.

3. Configuration of Photoelectric Conversion Layer

Next, the photoelectric conversion layer 39 in the photoelectric conversion unit 30 will be described in detail. FIG. 3A schematically illustrates a cross-section of the photoelectric conversion unit 30 in a unit pixel cell 20. In each unit pixel cell 20, the photoelectric conversion unit 30 includes the counter electrode 38, the pixel electrode 32, and the photoelectric conversion layer 39. The photoelectric conversion layer 39 is sandwiched between the counter electrode 38 and the pixel electrode 32.

In order to suppress the generation of leak current, the photoelectric conversion layer 39 is not separate for each pixel. That is, the photoelectric conversion layer 39 is formed to extend over a plurality of unit pixel cells 20. The photoelectric conversion layer 39 contains semiconducting carbon nanotubes 105 and a charge separation material 106.

Figure 4A:
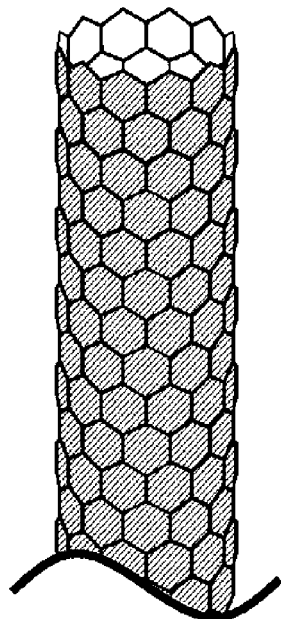
FIG. 4A schematically illustrates an example of the structure of a carbon nanotube.

The carbon nanotubes will be described in detail. As illustrated in FIG. 4A, each carbon nanotube has a structure obtained by wrapping, into a cylinder, a single-layer graphite sheet called graphene on which carbon atoms are disposed at the vertexes of hexagons. As carbon nanotubes, there are single-walled carbon nanotubes and multi-walled carbon nanotubes. In the imaging device according to the present disclosure, either the single-walled carbon nanotubes or the multi-walled carbon nanotubes may be used. Note that in order to control the physical properties of the carbon nanotubes in accordance with chirality, which will be described later, the single-walled carbon nanotubes are desirably used.

Figure 4B:
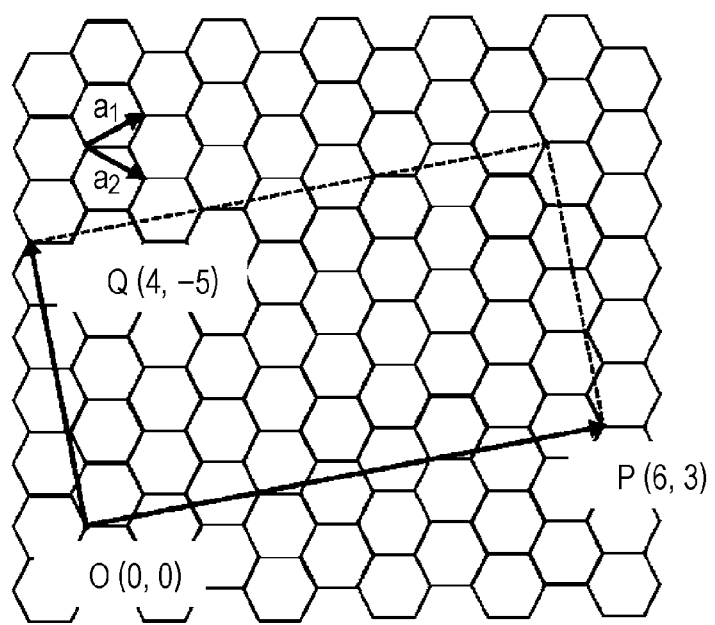
FIG. 4B schematically illustrates the chirality of a carbon nanotube.

In a case of wrapping graphene into a cylinder, carbon nanotubes having different diameters and different carbon arrangements can be formed depending on the thickness of the cylinder or the shift amount between both ends of a graphene sheet in the longitudinal direction. As illustrated in FIG. 4B, a rectangle having principal lattice vectors $a_1$ and $a_2$ and two sides OP and OQ in a two-dimensional arrangement of carbon atoms at vertexes of hexagons will be considered. With point O being the origin, point P is represented by a vector (6,3). This rectangle is wrapped in such a manner that point P corresponds to point O, and a resultant carbon nanotube is referred to as a carbon nanotube with a chirality (6,3).

By specifying the chirality, the positions of carbon atoms in the carbon nanotube are determined. Therefore, in accordance with chirality, the electronic structure of the carbon nanotube is determined, and the physical properties of the carbon nanotube are determined. That is, a given carbon nanotube is specified by a chiral vector represented by $C=na_1+ma_2$ (where n and m are integers). At this time, (n,|m|) is called a chiral index or chirality. Note that |m| represents the absolute value of m. In this representation of chirality, right-handed wrapping and left-handed wrapping of the carbon nanotube are not distinguished.

There are carbon nanotubes having metallic properties and carbon nanotubes having semiconducting properties. Carbon nanotubes can have metallic properties or semiconducting properties depending on chirality. In the imaging device according to the present disclosure, semiconducting carbon nanotubes are used. That is, the carbon nanotubes are used not as simple electric conductors, but as light detectors, specifically, generators of hole-electron pairs through photoelectric conversion. It is desirable that the ratio of metallic carbon nanotubes in the photoelectric conversion layer 39 be small. It is more desirable that the metallic carbon nanotubes be excluded. This is because hole-electron pairs that have been generated disappear immediately in the metallic carbon nanotubes.

The carrier mobility of the semiconducting carbon nanotubes is not largely dependent on chirality. Typically, the hole mobility and the electron mobility of the semiconducting carbon nanotubes are each several tens of thousands of square centimeters per volt-second, which is ten times or more higher the electron mobility of silicon.

The resonant wavelength, that is, the absorption wavelength, of the carbon nanotubes is dependent on chirality. Thus, by changing chirality, the absorption wavelength of the carbon nanotubes can be adjusted.

Figure 5:
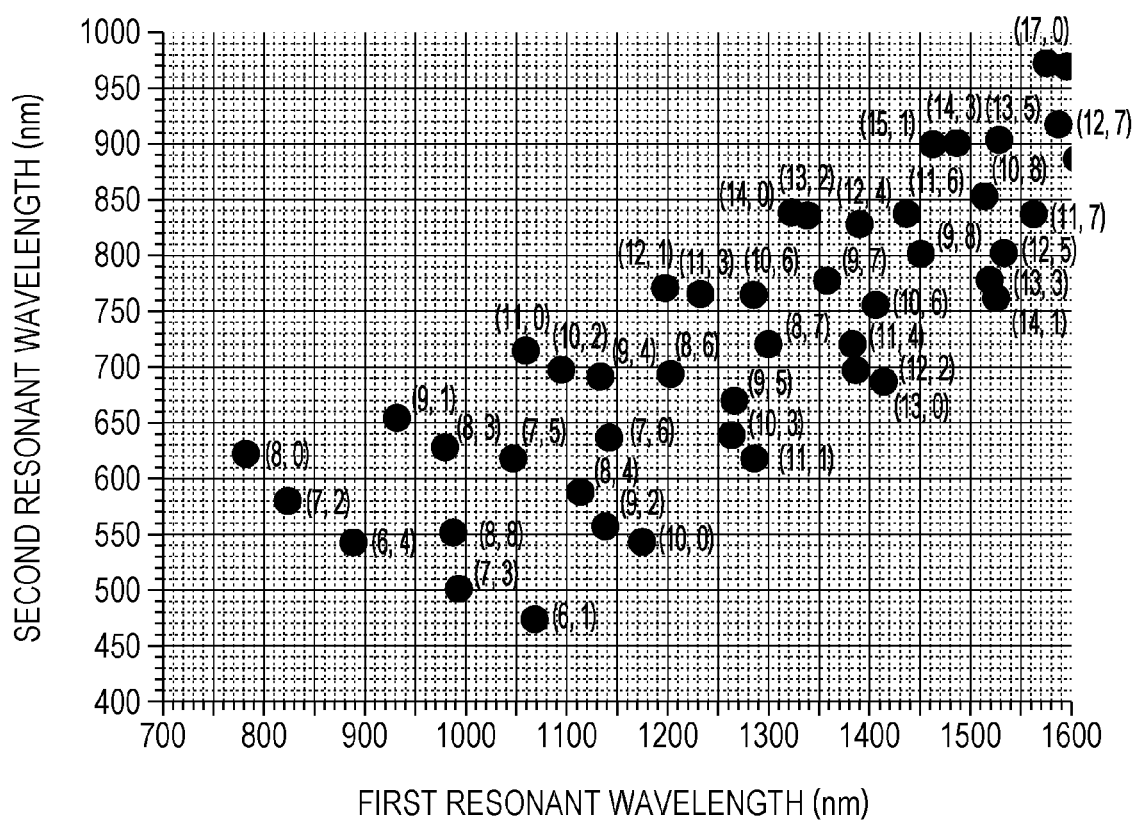
FIG. 5 illustrates the relationship between the chirality of a carbon nanotube and first and second resonant wavelengths.

FIG. 5 illustrates the relationship between the chirality of a semiconducting carbon nanotube and first and second resonant wavelengths. The first resonant wavelength refers to the longest wavelength at which resonance occurs, and the second resonant wavelength refers to the second longest wavelength at which resonance occurs. Although not illustrated, the semiconducting carbon nanotube may have other resonant wavelengths.

It is found from FIG. 5 that wavelengths that can be resonantly absorbed are distributed in the visible region to the far-infrared region. In particular, a semiconducting carbon nanotube having a diameter of about 1 nm, which are manufactured with ease, have resonant wavelengths that are distributed from the visible region to the near-infrared region where the wavelength is about 1.6 μm.

For example, a semiconducting carbon nanotube having a chirality (8,0) has a resonant wavelength of about 780 nm. In addition, a semiconducting carbon nanotube having a chirality (7,2) has a resonant wavelength of about 820 nm. Deoxyhemoglobins absorbs light more than oxyhemoglobins at a wavelength of 780 nm, and oxyhemoglobins have higher absorption than deoxyhemoglobins at a wavelength of 820 nm. Thus, by using the semiconducting carbon nanotubes having such chiralities for a photoelectric conversion layer, an imaging device that enables imaging of the oxygen concentration in blood can be realized.

For example, semiconducting carbon nanotubes having chiralities (12,4), (10,6), (13,0), and the like resonantly absorb near-infrared light of about 1.4 μm. This corresponds to a wavelength band that is deficit in sunlight. Thus, by using the semiconducting carbon nanotubes having such chiralities for a photoelectric conversion layer and by using illumination light having a wavelength of about 1.4 μm, an imaging device that enables image capturing without being influenced by sunlight can be realized.

In addition, a semiconducting carbon nanotube having a chirality (8,7) has a resonant wavelength of about 1.3 μm. This is close to the wavelength band that is deficit in sunlight, but sunlight does not attenuate very much at this wavelength. Thus, by using semiconducting carbon nanotubes having such a chirality for a photoelectric conversion layer, an imaging device that enables image capturing using sunlight near the wavelength band that is deficit in sunlight can be realized.

Furthermore, each semiconducting carbon nanotube has several resonant wavelengths, and the resonant wavelengths may be present in the near-infrared region and in the visible region. For example, resonance of a semiconducting carbon nanotube having a chirality (10,6) is present at about 750 nm in a visible region in addition to about 1.4 μm in the infrared region. Thus, by using semiconducting carbon nanotubes having such a chirality for a photoelectric conversion layer in combination with an optical filter or the like, an imaging device that enables multispectral imaging is realized.

The photoelectric conversion layer 39 may contain the semiconducting carbon nanotubes 105 having a predetermined one chirality or may contain the semiconducting carbon nanotubes 105 having two or more different chiralities. By the semiconducting carbon nanotubes 105 having two or more different chiralities being contained, the wavelength band of light that can be detected by the imaging device can be expanded.

Semiconducting carbon nanotubes having resonant wavelengths in the visible and near-infrared region have a diameter of about 1 nm.

Next, the charge separation material 106 will be described in detail. The charge separation material 106 can have a semiconducting property, a semi-metallic property, or the like. Among hole-electron pairs generated by the semiconducting carbon nanotubes 105 receiving light, the charge separation material 106 separates holes or electrons from the semiconducting carbon nanotubes 105. In this embodiment, the charge separation material 106 separates, from the semiconducting carbon nanotubes 105, holes or electrons that are not to be detected as signal charges.

For example, if holes are used as signal charges, the voltage supply circuit 10 supplies the counter electrode 38 with a bias voltage that is set in such a manner that the potential of the pixel electrode 32 is lower than the potential of the counter electrode 38. In this case, a substance having a larger electron affinity than the semiconducting carbon nanotubes 105 can be used as the charge separation material 106.

Figure 6A:
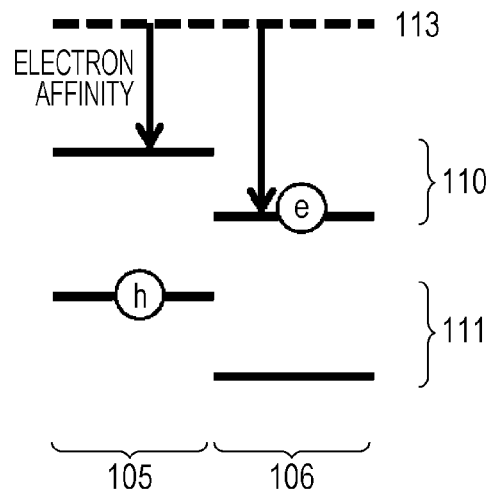
FIG. 6A schematically illustrates the magnitude relationship between the electron affinity of a semiconducting carbon nanotube and the electron affinity of a charge separation material in the imaging device according to the first embodiment of the present disclosure.

As illustrated in FIG. 6A, the electron affinity is defined as the energy difference from the bottom of a conduction band 110 to a vacuum level 113 in semiconductors. If a semiconductor is an organic semiconductor, the electron affinity is the energy difference between the LUMO level and the vacuum level. More typically, the electron affinity is the maximum energy difference between an energy level at which one extra electron can be received in a neutral state and the vacuum level. If the charge separation material 106 is a substance having a larger electron affinity than the semiconducting carbon nanotubes 105, among hole-electron pairs generated in the semiconducting carbon nanotubes 105, electrons move to the conduction band 110 of the charge separation material 106, which is at a lower energy level. Thus, holes remain in a valence band 111 of the semiconducting carbon nanotubes 105.

Since a bias voltage that is set in such a manner that the potential of the pixel electrode 32 is lower than the potential of the counter electrode 38 is supplied, holes move from the semiconducting carbon nanotubes 105 to the pixel electrode 32.

The electron affinity of semiconducting carbon nanotubes having resonant wavelengths in the visible and near-infrared region is about 3 eV to 4 eV. Examples of the substance having a larger electron affinity than the semiconducting carbon nanotubes 105 typically include fullerene and fullerene derivatives. Fullerene and fullerene derivatives are referred to as molecules having fullerene skeletons. For example, C60 has an electron affinity of about 4 eV. Besides, C70, C80, and compounds obtained by introducing modifying groups to such fullerene skeletons, such as phenyl-C61-butyric acid methyl ester (PCBM), indene-C60 bisadduct (ICBA), and indene-C60 monoadduct (ICMA), also have electron affinity of about 3.7 eV to 3.8 eV.

For example, if electrons are used as signal charges, the voltage supply circuit 10 supplies the counter electrode 38 with a bias voltage that is set in such a manner that the potential of the pixel electrode 32 is higher than the potential of the counter electrode 38. In this case, a substance having a smaller ionization energy than the semiconducting carbon nanotubes 105 can be used as the charge separation material 106.

Figure 6B:
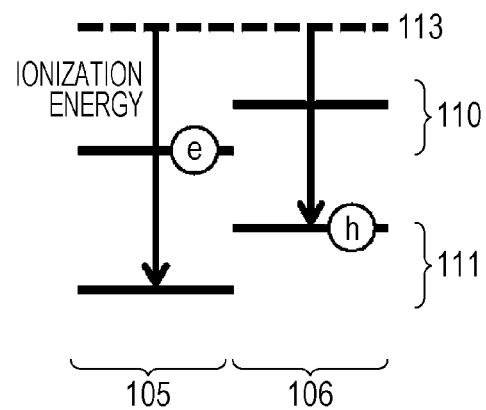
FIG. 6B schematically illustrates the magnitude relationship between the ionization energy of the semiconducting carbon nanotube and the ionization energy of the charge separation material in the imaging device according to the first embodiment.

As illustrated in FIG. 6B, the ionization energy is defined as the energy difference from the bottom of the valence band 111 to the vacuum level 113 in semiconductors. If a semiconductor is an organic semiconductor, the ionization energy is the energy difference between the HOMO level and the vacuum level. More typically, the ionization energy is the minimum energy necessary to elevate one electron from the neutral state to the vacuum level. If the charge separation material 106 is a substance having a smaller ionization energy than the semiconducting carbon nanotubes 105, the charge separation material 106 is more stabilized by becoming a positive ion. Thus, among hole-electron pairs generated in the semiconducting carbon nanotubes 105, holes move to the valence band 111 of the charge separation material 106. Thus, electrons remain in the conduction band 110 of the semiconducting carbon nanotubes 105.

Since a bias voltage that is set in such a manner that the potential of the pixel electrode 32 is higher than the potential of the counter electrode 38 is supplied to the counter electrode 38, electrons move from the semiconducting carbon nanotubes 105 to the pixel electrode 32.

The ionization energy of semiconducting carbon nanotubes having resonant wavelengths in the visible and near-infrared region is about 4 eV to 5 eV. Examples of a substance having a smaller ionization energy than the semiconducting carbon nanotubes 105 include poly(3-dodecylthiophene-2,5-diyl) (P3DDT, ionization energy: about 4.6 eV), poly(3-hexylthiophene-2,5-diyl) (P3HT, ionization energy: about 5 eV), and the like.

As described above, the electronic structures of the semiconducting carbon nanotubes 105 differ depending on chirality. Thus, the electron affinity and ionization energy of the semiconducting carbon nanotubes 105 also differ depending on chirality. Accordingly, it is desirable to calculate the electron affinity and the ionization energy of the semiconducting carbon nanotubes 105 in consideration of chirality to select the charge separation material 106 so as to satisfy the above-described relationship.

In the photoelectric conversion layer 39, both the semiconducting carbon nanotubes 105 and the charge separation material 106 may be dispersed. In this case, the distribution of the semiconducting carbon nanotubes 105 and the charge separation material 106 does not have to be uniform. For example, the distribution may be biased in the thickness direction of the photoelectric conversion layer 39.

It is desirable that signal charges be movable from the semiconducting carbon nanotubes 105 to the pixel electrode 32. In other words, it is desirable that the semiconducting carbon nanotubes 105 be electrically connected to the pixel electrode 32. For example, some of the semiconducting carbon nanotubes 105 may be in direct contact with the pixel electrode 32.

As illustrated in FIG. 3B, the photoelectric conversion unit 30 may further include a hole blocking layer 103 and an electron blocking layer 101. These layers are disposed at positions where the movement of holes and electrons is desirably suppressed. For example, if the pixel electrode 32 captures electrons, the hole blocking layer 103 is provided between the pixel electrode 32 and the photoelectric conversion layer 39, and the electron blocking layer 101 is provided between the counter electrode 38 and the photoelectric conversion layer 39.

The hole blocking layer 103 transports negative charges generated in the photoelectric conversion layer 39 to the pixel electrode 32 and prevents positive charges from entering the photoelectric conversion layer 39 from the pixel electrode 32. It is desirable to provide the hole blocking layer 103 in order to suppress current that flows even when light is not illuminated, which is so-called dark current. For example, bathocuproine (BCP) can be used for the hole blocking layer 103.

The electron blocking layer 101 has a role of transporting positive charges generated in the photoelectric conversion layer 39 to the counter electrode 38 and prevents negative charges from entering the photoelectric conversion layer 39 from the counter electrode 38. It is desirable to provide the electron blocking layer 101 in order to suppress dark current. For example, poly(3,4-ethylenedioxythiophene)-poly(styrenesulfonate) (PEDOT/PSS) can be used for the electron blocking layer 101.

The hole blocking layer 103 and the electron blocking layer 101 are both electrically conductive in order to transport electrons (negative charges) and holes (positive charges). Thus, if the hole blocking layer 103 is provided between the pixel electrode 32 and the photoelectric conversion layer 39, by some of the semiconducting carbon nanotubes 105 being in contact with the hole blocking layer 103, the semiconducting carbon nanotubes 105 are electrically connected to the pixel electrode 32 through the hole blocking layer 103. In addition, if the electron blocking layer 101 is provided between the pixel electrode 32 and the photoelectric conversion layer 39, by some of the semiconducting carbon nanotubes 105 being in contact with the electron blocking layer 101, the semiconducting carbon nanotubes 105 are electrically connected to the pixel electrode 32 through the electron blocking layer 101.

If the hole blocking layer 103 is provided between the photoelectric conversion layer 39 and the pixel electrode 32, the hole blocking layer 103 may be provided in any manner as long as signal charges can move between the semiconducting carbon nanotubes 105 and the hole blocking layer 103 and between the hole blocking layer 103 and the pixel electrode 32. Some of the semiconducting carbon nanotube 105 may be in direct contact with the hole blocking layer 103.

The semiconducting carbon nanotubes 105 do not have to be in direct contact with the pixel electrode 32 or the hole blocking layer 103 as long as signal charges can move. This is because the signal charges can move through another charge transport material or by the tunneling phenomenon or the like. Note that the charge transportation through the other charge transport material and by the tunneling phenomenon is typically slower than the charge transportation through the semiconducting carbon nanotubes 105. Accordingly, it is desirable that as many semiconducting carbon nanotubes 105 as possible be in direct contact with the pixel electrode 32 or the hole blocking layer 103, or it is desirable that some of the semiconducting carbon nanotube 105 be distributed to the vicinity of the pixel electrode 32 or the hole blocking layer 103.

Note that if holes are captured as signal charges, the electron blocking layer 101 is provided between the photoelectric conversion layer 39 and the pixel electrode 32. In this case, by replacing the hole blocking layer 103 with the electron blocking layer 101, the arrangement of the semiconducting carbon nanotubes 105 can be described in the same manner.

In the photoelectric conversion layer 39, it is desirable that as many molecules of the semiconducting carbon nanotubes 105 as possible be in contact with the pixel electrode 32 or a larger number of molecules of the semiconducting carbon nanotubes 105 be distributed closer to the pixel electrode 32. Thus, the density of the semiconducting carbon nanotubes 105 in the thickness direction of the photoelectric conversion layer 39 may be low on the counter electrode 38 side and may be high on the pixel electrode 32 side. In this case, it is desirable that the density of the charge separation material 106 in the thickness direction of the photoelectric conversion layer 39 be high on the counter electrode 38 side and be low on the pixel electrode 32 side.

As illustrated in FIG. 3A, the photoelectric conversion layer 39 may include a layer 39a containing only the charge separation material 106 and a layer 39b containing only the semiconducting carbon nanotubes 105. In this case, the layer 39b containing only the semiconducting carbon nanotubes 105 is in contact with the pixel electrode 32, and the layer 39a containing only the charge separation material 106 is in contact with the counter electrode 38.

The thickness of the photoelectric conversion layer 39 is, for example, greater than or equal to several tens of nanometers and less than or equal to several hundreds of nanometers. In addition, the photoelectric conversion layer 39 may further include an n-type semiconductor or a p-type semiconductor.

4. Charge Movement in Photoelectric Conversion Layer 39

Figure 7:
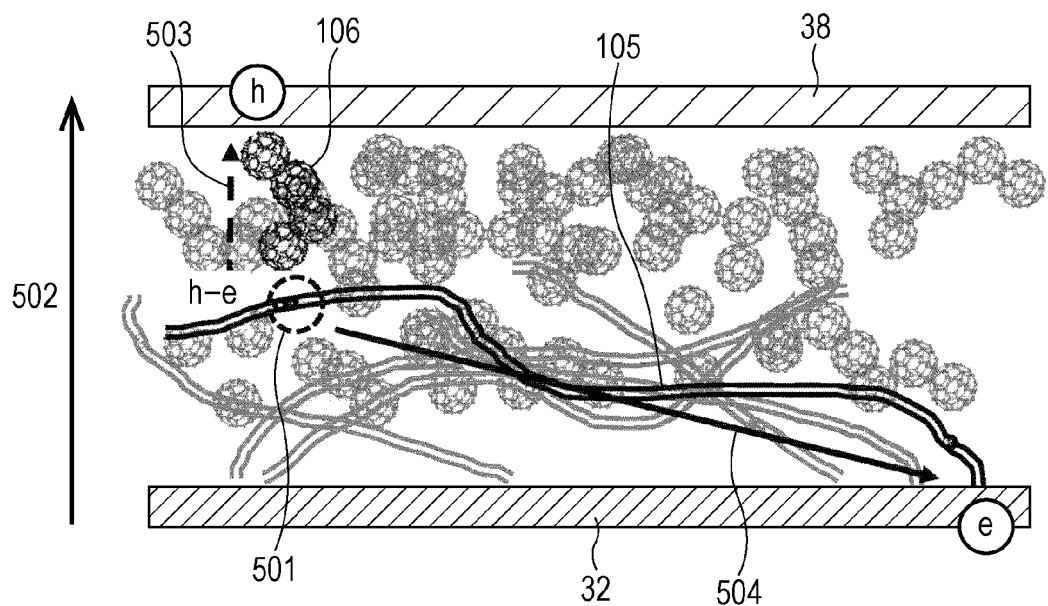
FIG. 7 schematically illustrates charge movement in the photoelectric conversion unit of the imaging device according to the first embodiment of the present disclosure.

The detection of incident light in the photoelectric conversion layer 39 will be described with reference to FIG. 7. FIG. 7 schematically illustrates the positional relationship among the semiconducting carbon nanotubes 105 and the charge separation material 106 in the photoelectric conversion layer 39, the pixel electrode 32, and the counter electrode 38. In FIG. 7, only a semiconducting carbon nanotube 105 of interest and a charge separation material 106 of interest are denoted by solid lines. In the following example, electrons are used as signal charges. In addition, the charge separation material 106 is a substance having a smaller ionization energy than the semiconducting carbon nanotube 105. In FIG. 7, a bias voltage is supplied to the counter electrode 38 in such a manner that the potential of the pixel electrode 32 is higher than the potential of the counter electrode 38. Thus, an electric field is generated in the direction indicated by an arrow 502.

Upon absorption of a photon (not illustrated) by the semiconducting carbon nanotube 105, a positive charge (hole) h and a negative charge (electron) e are generated at a position 501 that is substantially the same as the position of the absorption. The generated positive charge h and negative charge e have attractive forces with respect to each other, creating a state called an exciton. Excitons are electrically neutral in a macroscopic view and thus only move gradually so as to be dispersed, the positions of the excitons not being influenced by the applied electric field.

Upon an exciton arriving at a position close to the charge separation material 106, the charges of the exciton are separated. Specifically, the charge separation material 106 has a smaller ionization energy than the semiconducting carbon nanotube 105, and thus, the energy is more stabilized if the charge separation material 106 receives the positive charge h than if the semiconducting carbon nanotube 105 keeps the positive charge h. Therefore, the charge separation material 106 separates the positive charge h. Accordingly, the positive charge moves to one of the molecules of the charge separation material 106, and the negative charge e remains in the semiconducting carbon nanotube 105.

The charges are separated at the position where the semiconducting carbon nanotube 105 is close to the charge separation material 106. Accordingly, if one or more molecules of the charge separation material 106 are present within a unit pixel cell 20 of the periphery of one of the molecules of the semiconducting carbon nanotube 105, the charges are separated in the pixel where the exciton has been generated. In order to cause the exciton to be generated and the charges to be separated within the same unit pixel cell, the ratio of the charge separation material 106 contained in the photoelectric conversion layer 39 is desirably increased.

The negative charge e remaining in the semiconducting carbon nanotube 105 and the positive charge h that has moved to the charge separation material 106 are no longer neutral even in a macroscopic view. Accordingly, both the negative charge e and the positive charge h are influenced by the electric field indicated by the arrow 502 due to the voltage applied between the counter electrode 38 and the pixel electrode 32 and start to move.

The negative charge e remaining in the semiconducting carbon nanotube 105 is influenced by the electric field indicated by the arrow 502 and moves, within the semiconducting carbon nanotube 105, to the pixel electrode 32 side. This movement is extremely fast. As indicated by an arrow 504, the negative charge e moves to the position where the semiconducting carbon nanotube 105 is in contact with the pixel electrode 32 and is captured by the pixel electrode 32. That is, in the imaging device according to the present disclosure, the charges generated through photoelectric conversion are detected in an extremely short period.

On the other hand, the positive charge h that has moved to the one of the molecules of the charge separation material 106 moves to an adjacent molecule of the charge separation material 106 by hopping conduction. A molecule to which the positive charge h hops is determined by the distance between molecules and the direction and strength of the electric field. If the molecules have substantially equal distances therebetween, a molecule in a direction that is closer to the direction parallel to the electric field is selected as the hopping destination. If the strength of the electric field is strong, even though distances between molecules are different, the possibility that a molecule in a direction that is closer to the direction parallel to the electric field is selected as the hopping destination is higher. Accordingly, if the distribution of distances between molecules of the charge separation material 106 is not largely biased and the charge separation material 106 is distributed three-dimensionally in the photoelectric conversion layer 39, the positive charge h moves in the direction of the electric field in a macroscopic view and is captured by the counter electrode 38, as indicated by an arrow 503. A case where the distribution of distances between molecules is largely biased is, for example, a case where the molecules of the charge separation material 106 are arranged only on a certain plane.

Typically, the carrier mobility of the charge separation material 106 is considerably lower than the carrier mobility of the semiconducting carbon nanotube. The movement of the positive charge h between molecules of the charge separation material 106 by hopping is also slower than the carrier movement in the semiconducting carbon nanotube 105.

Although an example where the negative charge e is captured by the pixel electrode 32 has been described with reference to FIG. 7, the case where the positive charge h is captured by the pixel electrode 32 can be explained in the same manner. In this case, the charge separation material 106 can be a material having a larger electron affinity than the semiconducting carbon nanotube 105. Thus, the charge separation material 106 separates a negative charge e from an exciton. A positive charge h in the semiconducting carbon nanotube moves to the pixel electrode 32.

In addition, an example in which the negative charge e generated from the exciton is captured directly by the pixel electrode 32 from a molecule of the semiconducting carbon nanotube 105 has been described with reference to FIG. 7. However, the molecule of the semiconducting carbon nanotube 105 does not have to be in direct contact with the pixel electrode 32. In the photoelectric conversion layer 39, if two or more semiconducting carbon nanotubes 105 are close to each other or are in contact with each other, and if at least one of the semiconducting carbon nanotubes 105 is in contact with the pixel electrode 32, a charge can be captured by the pixel electrode 32. In this case, the charge of a semiconducting carbon nanotube 105 that is not in direct contact with the pixel electrode 32 moves as follows. First, the charge moves to another semiconducting carbon nanotube 105 that is close to or in contact with the semiconducting carbon nanotube 105 by hopping. By repeating this hopping, the charge moves to the semiconducting carbon nanotube 105 that is in direct contact with the pixel electrode 32. The charge ends up with being captured by the pixel electrode 32 from the semiconducting carbon nanotube 105 that is in direct contact with the pixel electrode 32.

As is clear from the above description, if the charge separation material 106, even in a small content, is contained in the photoelectric conversion layer 39, a hole or an electron among hole-electron pairs can be separated from the semiconducting carbon nanotube 105. The charge remaining in the carbon nanotube 105 moves rapidly among the semiconducting carbon nanotubes 105 and can be captured by the electrode 32. Accordingly, the imaging device according to the present disclosure can produce the above-described effects in accordance with the content of the charge separation material 106 in the photoelectric conversion layer 39.

In the above manner, the imaging device according to this embodiment includes semiconducting carbon nanotubes having a high carrier mobility, in which a pixel electrode captures a charge that moves through the semiconducting carbon nanotubes. Thus, an imaging device that enables image capturing with a high-speed operation and at a high frame rate can be realized. For example, a Time-of-Flight image sensor can be realized. In addition, carbon nanotubes have high chemical stability and are difficult to degrade the characteristics. Accordingly, an imaging device that can be used in a wide temperature range and that has high durability and high reliability can be realized. Furthermore, there are carbon nanotubes having different wavelength-sensitivity characteristics depending on the difference in chirality. Therefore, it is easy to design the wavelength-sensitivity characteristics. In addition, an imaging device that enables image capturing with multiple wavelengths can be realized.

In particular, in an organic thin film that absorbs light in the near-infrared region, due to the movement of organic molecules, holes-electron pairs generated through photoelectric conversion may be deactivated, or a transition level may vary. Accordingly, in an imaging device, noise tends to be generated in signals from charges that have been detected. In contrast, carbon nanotubes have a stable and rigid structure. Accordingly, the transition level is unlikely to vary, and signals from charges that have been detected can be obtained with a high S/N ratio.

5. Method for Fabricating Imaging Device

The imaging device 100 can be fabricated through a typical semiconductor fabrication process. In particular, if a silicon substrate is used as the semiconductor substrate 62, the imaging device 100 can be fabricated through a variety of silicon semiconductor processes.

First, as illustrated in FIG. 2, the amplifier transistor 42, the address transistor 44, and the reset transistor 46 are formed on the semiconductor substrate 62 by using a variety of semiconductor fabrication techniques. Then, the interlayer insulating layers 63A to 63C, the contact plugs 65A and 65B, the wirings 66A, 68A, and 68B, the plugs 67A to 67C, and the pixel electrode 32 are formed.

Then, as necessary, the hole blocking layer 103 is formed on the interlayer insulating layer 63C on which the pixel electrode 32 is provided. In a case of using BCP for the hole blocking layer 103, the hole blocking layer 103 is formed by evaporation. In a case of forming the hole blocking layer 103 with a material that can be dissolved in a solvent, a spin coating method, an inkjet method, or the like can be employed.

Then, the photoelectric conversion layer 39 is formed. The photoelectric conversion layer 39 contains the semiconducting carbon nanotubes 105 and the charge separation material 106. Among them, the semiconducting carbon nanotubes 105 are difficult to form by evaporation. Therefore, the semiconducting carbon nanotubes 105 and the charge separation material 106 are separately prepared and mixed together in a solvent and then are applied on the interlayer insulating layer 63C by spin coating, doctor blading, or inkjetting. Alternatively, the semiconducting carbon nanotubes 105 and the charge separation material 106 may be separately dispersed in different solvents and may be applied on the interlayer insulating layer 63C. Further alternatively, the semiconducting carbon nanotubes 105 may be applied on the interlayer insulating layer 63C, and the charge separation material 106 may be formed on the interlayer insulating layer 63C by evaporation. If the semiconducting carbon nanotubes 105 and the charge separation material 106 are disposed on the interlayer insulating layer 63C through different steps, the semiconducting carbon nanotubes 105 and the charge separation material 106 may be alternately provided on the interlayer insulating layer 63C, and the semiconducting carbon nanotubes 105 or the charge separation material 106 may be provided at least twice in order to disperse both the semiconducting carbon nanotubes 105 and the charge separation material 106.

In order to disperse the semiconducting carbon nanotubes 105 in a solvent, a polymer or a surface-active agent may be used as a solubilizing agent. Such a solubilizing agent may remain in the photoelectric conversion layer 39 unless having adverse effects on the characteristics of an image sensor. Alternatively, only the solubilizing agent may be removed after an applying step.

The semiconducting carbon nanotubes 105 can be obtained by selecting semiconducting ones from among manufactured semiconducting carbon nanotubes. Examples of a method for manufacturing semiconducting carbon nanotubes include a HiPco method, a CoMoCAT method, an alcohol CVD method, and an arc discharge method. Alternatively, such a method may be employed after performing a chirality selecting operation in order to increase a desired composition ratio of chirality. Such methods for selecting semiconducting ones and selecting chirality are described in, for example, (1) T. Tanaka et al., Applied Physics Express 2008, VOL. 1, p. 114001, (2) H. Liu et al., Nature Communications 2011, DOI:10.1038/ncomms1313, (3) A. Nish et al., Nature Nanotechnology 2007, VOL. 2, pp. 640-646, and the like. By using semiconducting carbon nanotubes whose chirality is selected, the mixing ratio of metallic carbon nanotubes can be lower than that of carbon nanotubes that are grown directly on a substrate. As a result, an imaging device having excellent characteristics can be more easily realized. In particular, with the method disclosed in the above-described literature (3), semiconducting carbon nanotubes having substantially equal diameters and having different chiralities can be selected. Accordingly, in order to realize an imaging device that acquires images, such as multispectral images, in predetermined two or more wavelength ranges, it is desirable to use semiconducting carbon nanotubes whose chirality is selected by the method disclosed in the literature (3) or the like.

In a case of fabricating an imaging device in which the photoelectric conversion layer 39 in each pixel has the same spectral sensitivity characteristics, a large-area application technique such as spin coating or a doctor blading method can be used. In a case of fabricating an imaging device in which each pixel has different spectral sensitivity characteristics, the following methods can be employed. First, one or two or more dispersion liquids are prepared in which semiconducting carbon nanotubes having different chiralities are dispersed. Then, each dispersion liquid is selectively discharged by an inkjet method. Thus, the photoelectric conversion layer 39 having different spectral sensitivity characteristics for each pixel can be formed without a mask. The photoelectric conversion layer 39 having different spectral response characteristics for each pixel may alternatively be formed by employing spin coating, a doctor blading method, or the like together with a mask.

For example, semiconducting carbon nanotubes having a high ratio of a chirality (8,0) can be used for a first pixel, and semiconducting carbon nanotubes having a high ratio of a chirality (7,2) can be used for a second pixel. In this case, the first pixel has a higher sensitivity to light at a wavelength of 780 nm than the second pixel, and the second pixel has a higher sensitivity to light at a wavelength of 820 nm than the first pixel. Thus, by comparing images formed by each of the two kinds of pixels with each other, the oxidation-reduction degree of hemoglobin can be visualized as an image. Alternatively, semiconducting carbon nanotubes having a high ratio of a chirality (12,4), (10,6), (13,0), or the like can be used for the first pixel, and semiconducting carbon nanotubes having a chirality (8,7) or the like can be used for the second pixel. In this case, it is possible to acquire images at and near the wavelength band that is deficit in sunlight.

The charge separation material 106 can be, for example, a commercially available material. Alternatively, the charge separation material 106 may be provided on the interlayer insulating layer 63C by evaporation. As described above, in order to increase the distribution density of the charge separation material 106 on the pixel electrode 32 side and to suppress crosstalk among pixels, it is desirable to first provide the charge separation material 106 on the interlayer insulating layer 63C and to provide the semiconducting carbon nanotube 105 thereon.

Then, on the photoelectric conversion layer 39, the electron blocking layer 101 is formed by the same method as the hole blocking layer 103.

Then, the counter electrode 38 is formed. For example, ITO is formed by a sputtering method. Then, the protective layer 72 and microlenses 74 are formed, and thereby the imaging device is completed. In the above manner, with the method for fabricating the imaging device according to the present disclosure, the photoelectric conversion unit 30 can be fabricated without using crystallinity on the surface of a support body that supports the photoelectric conversion unit 30. In addition, the formation of the photoelectric conversion unit 30 does not include a step that needs high-temperature processing. Thus, the photoelectric conversion unit 30 can be stacked on a semiconductor substrate on which a signal detection circuit is provided, and a stacked imaging device can be realized.

Second Embodiment

A second embodiment is different from the first embodiment in that the charge separation material separates holes or electrons that are used as signal charges among hole-electron pairs generated in carbon nanotubes.

Carbon nanotubes typically have a length of about several tens of nanometers to several millimeters. In contrast, the thickness of the photoelectric conversion layer in the photoelectric conversion element is typically several nanometers to several hundreds of nanometers. Thus, if carbon nanotubes are used as a photoelectric conversion material for the photoelectric conversion element, carbon nanotubes disposed in parallel (in the direction perpendicular to the thickness direction) to the photoelectric conversion layer are longer than carbon nanotubes disposed in the thickness direction, in the photoelectric conversion layer.

Figure 8:
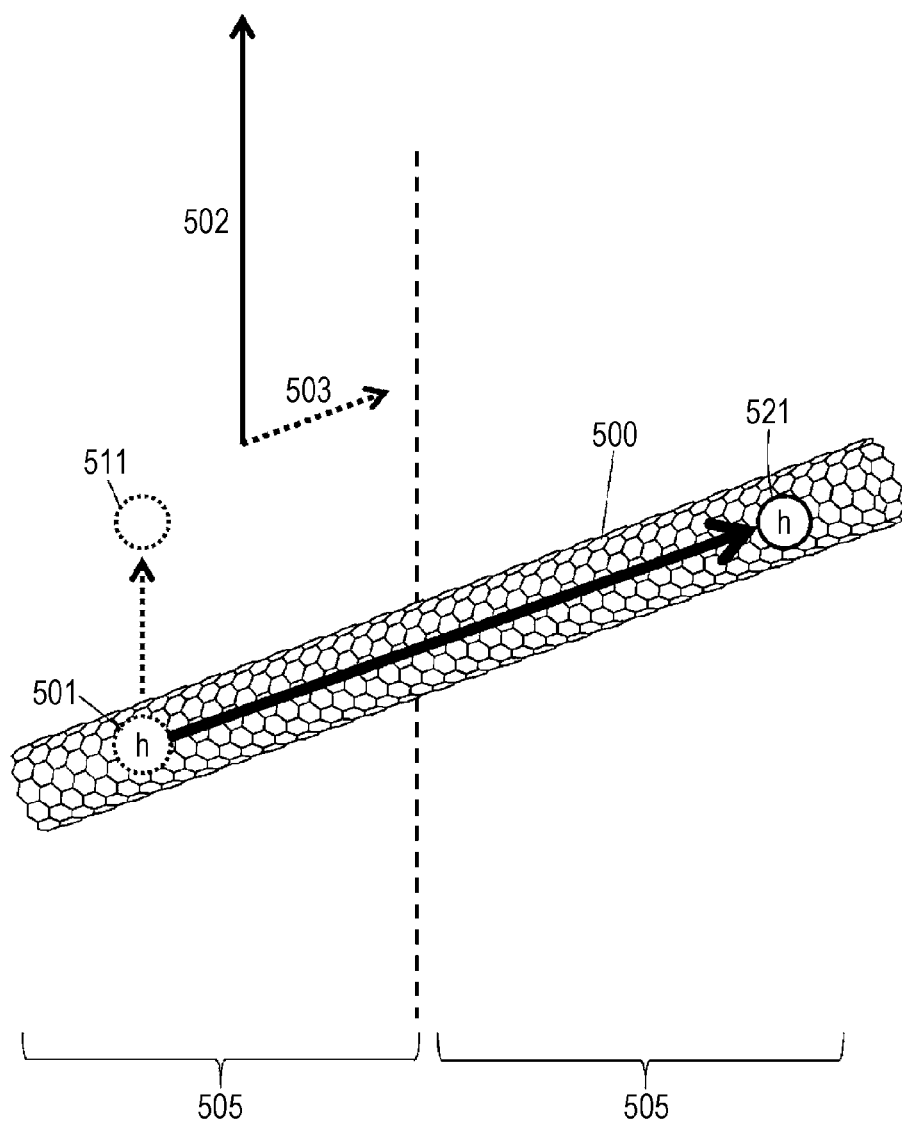
FIG. 8 schematically illustrates charge movement in a carbon nanotube.

In order to cause light to be incident on the photoelectric conversion layer and to efficiently capture holes or electrons among generated hole-electron pairs as signal charges, voltage is desirably applied to the photoelectric conversion layer. FIG. 8 schematically illustrates a carbon nanotube 500 located in the photoelectric conversion layer. A positive charge h is present at the position 501 of the carbon nanotube 500, and an electric field is applied from the outside in the direction of the arrow 502. If the charge h is present in a free space, the charge h moves to a position 511 in parallel to the arrow 502.

However, if the charge h is present in the carbon nanotube 500, the charge h has to first exit from the carbon nanotube 500 to the outside. Thus, the charge h has to overcome an energy barrier, based on a stochastic phenomenon.

On the other hand, the electric field indicated by the arrow 502 has electric field components in a longitudinal direction 503 of the carbon nanotube 500. It is known that the charge movement along the longitudinal direction of the carbon nanotube 500 receives little resistance, and it has been reported that the mobility in this direction is 10000 $cm^2/(V \cdot s)$ or higher. Accordingly, unless there are no electric field components in parallel to the longitudinal direction of the carbon nanotube 500, the charge h moves in the carbon nanotube 500 with ease to a position 521.

The imaging device includes a plurality of pixels and forms images by generating signals in proportion to the amount of light that is incident on each pixel. If carbon nanotubes are used for the photoelectric conversion layer, from the above-described reasons, charges generated through photoelectric conversion move in the carbon nanotubes. Thus, if the length of a carbon nanotube is greater than the size of a pixel 505, when a charge generated through photoelectric conversion moves in the carbon nanotube, a pixel that is different from the pixel on which light has been incident might detect the incident light. Even if the length of a carbon nanotube is smaller than the size of the pixel 505, the same applies when the carbon nanotube is located to extend over two pixels. As a result, crosstalk of the detected signal occurs among pixels, and a resultant image might blur, not correctly reflecting the distribution of an original illuminated light amount.

This issue becomes more apparent if the pitch between pixels is narrower as a result of a small size (angle of view) of the imaging device or a large number of pixels in accordance with high resolution of the imaging device. The imaging device according to this embodiment solves this issue and is particularly desirably used for an imaging device in which the pitch between pixels is narrow.

The general configuration of the imaging device according to this embodiment is the same as that of the imaging device according to the first embodiment illustrated in FIG. 1, for example. In addition, the device configuration of the imaging device according to this embodiment is the same as that of the imaging device according to the first embodiment illustrated in FIG. 2, for example.

Figure 9:
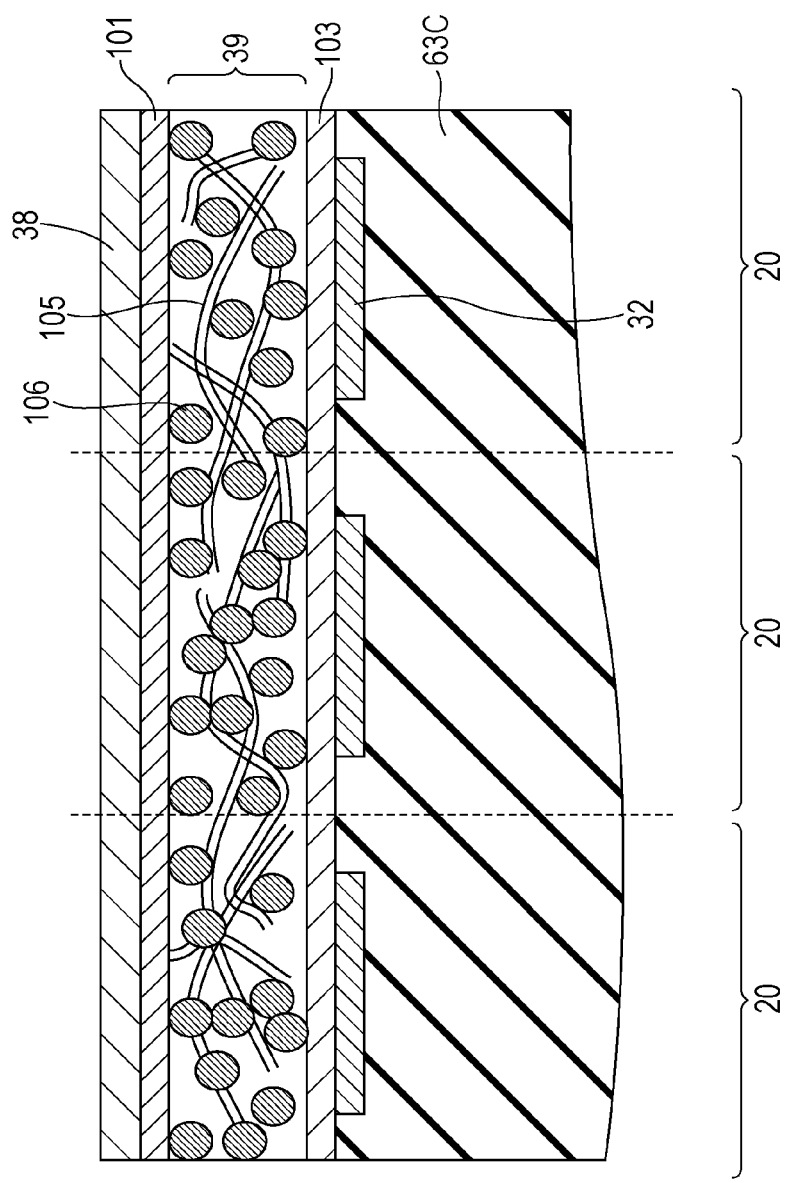
FIG. 9 schematically illustrates a cross-section of an example of the configuration of a photoelectric conversion unit of an imaging device according to a second embodiment.

Next, the photoelectric conversion layer 39 in the photoelectric conversion unit 30 of the imaging device according to this embodiment will be described in detail. FIG. 9 schematically illustrates a cross-section of the photoelectric conversion unit 30 that extends over a plurality of unit pixel cells 20. In each unit pixel cell 20, the photoelectric conversion unit 30 includes the counter electrode 38, the pixel electrode 32, and the photoelectric conversion layer 39. The photoelectric conversion layer 39 is sandwiched between the counter electrode 38 and the pixel electrode 32.

In order to suppress the generation of leak current, the photoelectric conversion layer 39 is not separate for each pixel and is formed to extend over the plurality of unit pixel cells 20. The photoelectric conversion layer 39 contains the semiconducting carbon nanotubes 105 and the charge separation material 106. At least some of the carbon nanotubes 105 are located to extend over the plurality of unit pixel cells 20.

The structure, physical properties, and the like of the carbon nanotubes 105 are as described in the first embodiment. In addition, any of the materials described in the first embodiment can be used as the charge separation material 106. That is, the charge separation material 106 may be a substance having a larger electron affinity than the semiconducting carbon nanotubes 105 or a substance having a smaller ionization energy than the semiconducting carbon nanotubes 105.

However, unlike in the first embodiment in which charges remaining in the carbon nanotubes are caused to move to the pixel electrode to be used as signal charges, in the second embodiment, charges separated by the charge separation material from the carbon nanotubes are caused to move to the pixel electrode. For example, if electrons, which are negative charges, are used as signal charges, the voltage supply circuit 10 supplies a bias voltage to the counter electrode 38 in such a manner that the potential of the pixel electrode 32 is higher than the potential of the counter electrode 38. In this case, a substance having a larger electron affinity than the semiconducting carbon nanotubes 105 can be used as the charge separation material 106. In this case, among hole-electron pairs generated in the semiconducting carbon nanotubes 105, electrons move to the conduction band 110 of the charge separation material 106 at a lower energy level. Thus, holes remain in the valence band of the semiconducting carbon nanotubes.

Since a bias voltage that is set in such a manner that the potential of the pixel electrode 32 is higher than the potential of the counter electrode 38 is supplied, electrons move from the charge separation material 106 to the pixel electrode 32. If holes, which are positive charges, are used as signal charges, the voltage supplying circuit supplies a bias voltage to the counter electrode 38 in such a manner that the potential of the pixel electrode 32 is lower than the potential of the counter electrode 38. In this case, a substance having a smaller ionization energy than the semiconducting carbon nanotubes 105 can be used as the charge separation material 106. In this case, the charge separation material 106 is more stabilized by becoming a positive ion. Thus, among hole-electron pairs generated in the semiconducting carbon nanotubes 105, holes move to the valence band of the charge separation material 106. Accordingly, electrons remain in the conduction band 110 of the semiconducting carbon nanotubes 105. These holes move to the pixel electrode. Since a bias voltage that is set in such a manner that the potential of the pixel electrode 32 is lower than the potential of the counter electrode 38 is supplied, the holes move from the charge separation material 106 to the pixel electrode 32.

In order to suppress issues caused by one-dimensional charge movement in the semiconducting carbon nanotubes 105, it is desirable that the charge movement in the charge separation material 106 not be one-dimensional. For example, in fullerene, fullerene derivatives, and most of low molecules, charges are restricted by molecular orbits. Thus, by applying an electric field from the outside, charges are biased in molecules, but the charge movement that generates current in a macroscopic view does not occur. That is, there is no degree of freedom in charge movement in the charge separation material 106 in a macroscopic view. In this case, the charge movement in the charge separation material 106 is zero-dimensional. In addition, a large number of conductive polymers have one-dimensional chain molecular shapes by a covalent bond and have a structure in which these chains are complicatedly tangled. In such conductive polymers, charges move by hopping conduction along the molecular chains and between molecular chains at positions that are spatially adjacent to each other due to tangles. The difference between the efficiencies of the two kinds of charge movement is much smaller than that in carbon nanotubes. Accordingly, charge moves three-dimensionally in conductive polymers.

In the photoelectric conversion layer 39, it is desirable that both the semiconducting carbon nanotubes 105 and the charge separation material 106 be dispersed. As long as both are dispersed, the distribution of the semiconducting carbon nanotubes 105 and the charge separation material 106 do not have to be uniform. For example, the distribution may be biased in the thickness direction of the photoelectric conversion layer 39. Specifically, unlike in the first embodiment, the density of the semiconducting carbon nanotubes 105 in the thickness direction of the photoelectric conversion layer 39 may be high on the counter electrode 38 side and may be low on the pixel electrode 32 side. In addition, the density of the charge separation material 106 in the thickness direction of the photoelectric conversion layer 39 may be low on the counter electrode 38 side and may be high on the pixel electrode 32 side. Such distribution is more desirable than the inverse density distribution in order for the charge separation material 106 to separate charges to be captured by the pixel electrode 32 from the semiconducting carbon nanotubes. The thickness of the photoelectric conversion layer 39 is, for example, greater than or equal to several tens of nanometers and less than or equal to several hundreds of nanometers. In addition, the photoelectric conversion layer 39 may further contain an n-type semiconductor or a p-type semiconductor.

As in the first embodiment, the photoelectric conversion unit 30 may further include the hole blocking layer 103 and the electron blocking layer 101. The hole blocking layer 103 and the electron blocking layer 101 can be formed of any of the materials described in the first embodiment.

Figure 10:
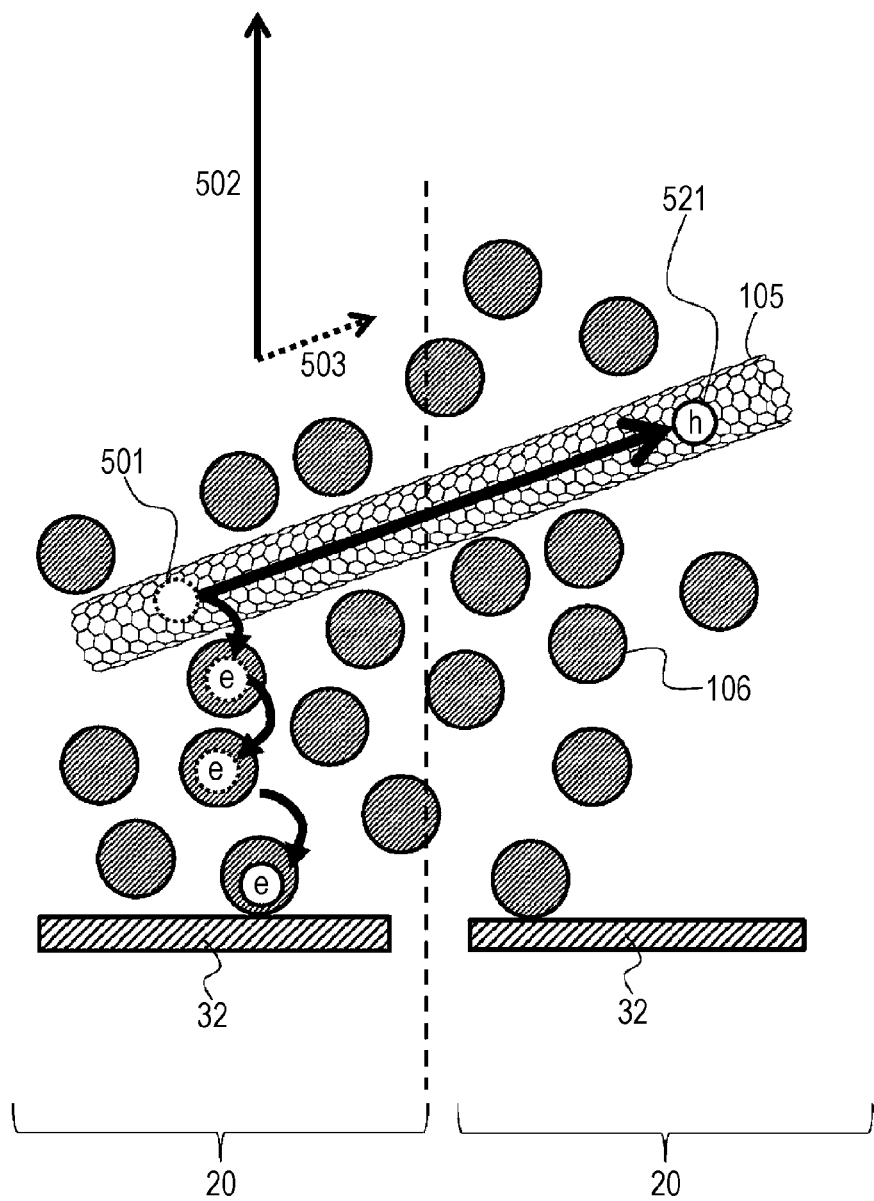
FIG. 10 schematically illustrates charge movement in the photoelectric conversion unit of the imaging device according to the second embodiment.

The detection of incident light in the photoelectric conversion layer 39 will be described with reference to FIG. 10. FIG. 10 schematically illustrates the positional relationship between the arrangement of a semiconducting carbon nanotube 105 and the charge separation material 106 located in the photoelectric conversion layer 39 and pixel electrodes 32 of unit pixel cells. The semiconducting carbon nanotube 105 is located to extend over two unit pixel cells 20. In the following example, electrons are used as signal charges as in the first embodiment. However, unlike in the first embodiment, the charge separation material 106 is a substance having a larger electron affinity than the semiconducting carbon nanotube 105. In addition, in FIG. 10, a bias voltage is supplied to the counter electrode 38 in such a manner that the potential of the pixel electrode 32 is higher than the potential of the counter electrode 38. Thus, an electric field is generated in the direction indicated by the arrow 502.

As in the first embodiment, upon absorption of a photon (not illustrated) by the semiconducting carbon nanotube 105, a positive charge (hole) h and a negative charge (electron) e are generated at the position 501 that is substantially the same as the position of the absorption. The generated positive charge h and negative charge e have attractive forces with respect to each other, creating a state called an exciton. Excitons are electrically neutral in a macroscopic view and thus only move gradually so as to be dispersed, the positions of the excitons not being influenced by the applied electric field.

Upon an exciton arriving at a position close to the charge separation material 106, the charges of the exciton are separated. Specifically, the charge separation material 106 separates the negative charge e, so that one of the charges moves to one of the molecules of the charge separation material 106, and the other charge remains in the semiconducting carbon nanotube 105. In the example illustrated in FIG. 7, since the charge separation material 106 has a larger electron affinity than the semiconducting carbon nanotube 105, the charge separation material 106 separates the negative charge e. As a result, the positive charge remains in the semiconducting carbon nanotube 105.

The charges are separated at the position where the semiconducting carbon nanotube 105 is close to the charge separation material 106. Accordingly, if one or more molecules of the charge separation material 106 are present within a unit pixel cell 20 in the periphery of one of the molecules of the semiconducting carbon nanotube 105, the charges are separated in the pixel where the exciton has been generated. In order to cause the exciton to be generated and the charges to be separated within the same unit pixel cell, the ratio of the charge separation material 106 contained in the photoelectric conversion layer 39 is desirably increased.

The positive charge h remaining in the semiconducting carbon nanotube 105 and the negative charge e that has moved to the charge separation material 106 are no longer neutral even in a macroscopic view. Accordingly, both the positive charge h and the negative charge e are influenced by the electric field indicated by the arrow 502 due to the voltage applied between the counter electrode 38 and the pixel electrode 32 and start to move.

The positive charge h remaining in the semiconducting carbon nanotube 105 moves by being strongly influenced by electric field components not only in the direction of the arrow 502 but also in the direction 503 along which the semiconducting carbon nanotube 105 extends, due to the anisotropy of electric conduction of a carbon nanotube. As a result, the positive charge h moves in the direction along which the semiconducting carbon nanotube 105 extends to arrive at the position 521. The positive charge h is captured by the counter electrode 38, which is not illustrated. Since the counter electrode 38 is formed to extend over a plurality of pixels, the positive charge h may be captured at any position.

On the other hand, the negative charge e that has moved to the one of the molecules of the charge separation material 106 moves to an adjacent molecule of the charge separation material 106 by hopping conduction. The molecule to which the positive charge h hops is determined by the distance between molecules and the direction and strength of the electric field. If the molecules have substantially equal distances therebetween, a molecule in a direction that is closer to the direction parallel to the electric field is selected as the hopping destination. If the strength of the electric field is strong, even though distances between molecules are different, the possibility that a molecule in a direction that is closer to the direction parallel to the electric field is selected as the hopping destination is higher.

Accordingly, if the distribution of distances between molecules of the charge separation material 106 is not largely biased and the charge separation material 106 is distributed three-dimensionally in the photoelectric conversion layer 39, the negative charge e moves in the direction of the electric field in a macroscopic view. A case where the distribution of distances between molecules is largely biased is, for example, a case where the molecules of the charge separation material 106 are arranged only on a certain plane. Accordingly, the negative charge e is captured by the pixel electrode 32 in a unit pixel cell 20 where the exciton has been generated. That is, the pixel on which light has been incident is the same as the pixel that detects the incident light.

Even if the charge movement in the charge separation material 106 is three-dimensional, charges move in the direction of the electric field in a macroscopic view. In addition, by increasing the difference in potential to be applied between the counter electrode 38 and the pixel electrode 32 and increasing the strength of the electric field, a negative charge can be more reliably detected in a pixel where an exciton has been generated.

Although an example where the negative charge e is captured by the pixel electrode 32 has been described with reference to FIG. 10, the case where the positive charge h is captured by the pixel electrode 32 can be explained in the same manner. In addition, although FIG. 10 illustrates the single semiconducting carbon nanotube 105, two or more semiconducting carbon nanotubes 105 might be close to each other in the photoelectric conversion layer 39. In this case, in addition to the above-described (i) charge separation between the semiconducting carbon nanotube 105 and the charge separation material 106 and (ii) charge movement among molecules of the charge separation material 106, (iii) charge separation between the two or more semiconducting carbon nanotubes 105 and (iv) charge movement from the semiconducting carbon nanotubes 105 to the charge separation material 106 may occur. However, the semiconducting carbon nanotubes 105 having the same chirality have equal electron affinity and ionization energy. In addition, from the view point of the electron affinity or ionization energy, a positive charge or negative charge to be detected as a signal advantageously moves from the semiconducting carbon nanotubes 105 to the charge separation material 106 in terms of energy. Accordingly, the positive charge or negative charge is difficult to move from the charge separation material 106 to the semiconducting carbon nanotubes 105. Thus, charge movement and the like in (iii) and (iv) are disadvantageous over (i) and (ii) in terms of energy and are difficult to occur.

In addition, as is clear from the above description, if the charge separation material 106, even in a small content, is contained in the photoelectric conversion layer 39, a charge to be detected as a signal in the semiconducting carbon nanotubes 105 can be separated from the semiconducting carbon nanotubes 105 and can be moved toward the pixel electrode 32 in accordance with the electric field applied between the counter electrode 38 and the pixel electrode 32. Accordingly, the imaging device according to the present disclosure can produce the above-described effects in accordance with the content of the charge separation material 106 in the photoelectric conversion layer 39.

In the above manner, according to this embodiment, in addition to the effects described in the first embodiment, an imaging device that can suppress mixing of detected charges among pixels and that can acquire high-definition images or an imaging device having a minute pixel size can be realized.

The imaging device according to this embodiment can be fabricated through a typical semiconductor fabrication process as in the imaging device according to the first embodiment. In particular, if a silicon substrate is used as the semiconductor substrate 62, the imaging device can be fabricated through a variety of silicon semiconductor processes.

Note that the above embodiments have described examples in which each of the amplifier transistor 42, the address transistor 44, and the reset transistor 46 is an n-channel MOS transistor. However, the transistors in the embodiments of the present disclosure are not limited to n-channel MOS transistors. The amplifier transistor 42, the address transistor 44, and the reset transistor 46 may be p-channel MOS transistors. In addition, all of the amplifier transistor 42, the address transistor 44, and the reset transistor 46 do not have to be n-channel MOS transistors or p-channel MOS transistors. As a transistor, an FET or a bipolar transistor can also be used.

In addition, each of the above embodiments has described an imaging device having a mode in which the pixel electrode captures a charge to be detected. However, the imaging device may include an impurity diffused region provided in the semiconductor substrate instead of the pixel electrode, and the impurity diffused region may capture a hole or an electron among hole-electron pairs generated in the photoelectric conversion layer as a charge to be detected.

The imaging device according to the present disclosure can desirably be used as a variety of imaging devices that can acquire images in the visible region and in the near-infrared region. In particular, the imaging device can be desirably used as an imaging device with a high-speed operation and a high frame rate, a high-definition imaging device with a large number of pixels, and/or an imaging device with a minute pixel size.

What is claimed is:

1. An imaging device comprising:
    pixels, each of the pixels including:
        a photoelectric conversion layer that contains semiconductor carbon nanotubes absorbing light and generating electric charges, and a first material; and
        a charge capturing unit that captures the electric charges generated by the semiconductor carbon nanotubes; and
    an electronic circuit that converts the electric charges captured by the charge capturing unit into a signal representing an image,
    wherein the semiconductor carbon nanotubes have a chirality such that the first material has an electron affinity larger than that of the semiconducting carbon nanotubes.

2. The imaging device according to claim 1, wherein the charge capturing unit captures positive charges.

3. The imaging device according to claim 1, further comprising:
    a semiconductor substrate that supports the photoelectric conversion layer, wherein
    the electronic circuit includes a charge detecting transistor that is provided on the semiconductor substrate and is electrically connected to the charge capturing unit.

4. The imaging device according to claim 3, wherein each of the pixels comprises an impurity diffusion region in the semiconductor substrate electrically connected to the photoelectric conversion unit.

5. The imaging device according to claim 3, wherein the charge capturing unit is an electrode located above the semiconductor substrate.

6. The imaging device according to claim 1, wherein the photoelectric conversion layer is continuous among the pixels.

7. The imaging device according to claim 6, wherein at least one of the semiconductor carbon nanotubes is located to extend over two pixels of the pixels.

8. The imaging device according to claim 1, wherein the semiconductor carbon nanotubes have the chirality such that the semiconductor carbon nanotubes have an absorption peak in a near-infrared region, and the image is a near-infrared image.

9. The imaging device according to claim 8, wherein the absorption peak exists in a wavelength band that is deficient in sunlight.

10. The imaging device according to claim 1, wherein the semiconductor carbon nanotubes includes two or more kinds of semiconductor carbon nanotubes that have different chiralities each other.

11. The imaging device according to claim 10, wherein the image is a multispectral image.

12. The imaging device according to claim 1, wherein the first material is a molecule having a fullerene skeleton.

13. The imaging devise imaging device according to claim 1, wherein
    the photoelectric conversion layer is disposed between an electrode and the charge capturing unit, and
    a density of the semiconductor carbon nanotubes is higher on the electrode side than on the charge capturing unit side.

14. The imaging devise imaging device according to claim 1, wherein
    the photoelectric conversion layer is disposed between an electrode and the charge capturing unit, and
    a density of the semiconducting carbon nanotubes is higher on the charge capturing unit side than on the electrode side.

15. An imaging device comprising:
    pixels, each of the pixels including:
        a photoelectric conversion layer that contains semiconductor carbon nanotubes absorbing light and generating electric charges, and a first material; and
        a charge capturing unit that captures the electric charges generated by the semiconductor carbon nanotubes; and
    an electronic circuit that converts the electric charges captured by the charge capturing unit into a signal representing an image,
    wherein the semiconductor carbon nanotubes have a chirality such that the first material has an ionization energy smaller than that of the semiconductor carbon nanotubes.

16. The imaging device according to claim 15, wherein the charge capturing unit captures negative charges.

17. The imaging device according to claim 15, further comprising:
    a semiconductor substrate that supports the photoelectric conversion layer, wherein
    the electronic circuit includes a charge detecting transistor that is provided on the semiconductor substrate and is electrically connected to the charge capturing unit.

18. The imaging device according to claim 17, wherein each of the pixels comprises an impurity diffusion region in the semiconductor substrate electrically connected to the photoelectric conversion unit.

19. The imaging device according to claim 17, wherein the charge capturing unit is an electrode located above the semiconductor substrate.

20. The imaging device according to claim 15, wherein the photoelectric conversion layer is continuous among the pixels.

21. The imaging device according to claim 20, wherein at least one of the semiconductor carbon nanotubes is located to extend over two pixels of the pixels.

22. The imaging device according to claim 15, wherein:
    the semiconductor carbon nanotubes have the chirality such that the semiconductor carbon nanotubes have an absorption peak in a near-infrared region, and
    the image is a near-infrared image.

23. The imaging device according to claim 22, wherein the absorption peak exists in a wavelength band that is deficient in sunlight.

24. The imaging device according to claim 15, wherein the semiconductor carbon nanotubes includes two or more kinds of semiconductor carbon nanotubes that have different chiralities each other.

25. The imaging device according to claim 24, wherein the image is a multispectral image.

26. The imaging devise imaging device according to claim 15, wherein:
   the photoelectric conversion layer is disposed between an electrode and the charge capturing unit, and
   a density of the semiconductor carbon nanotubes is higher on the electrode side than on the charge capturing unit side.

27. The imaging devise imaging device according to claim 15, wherein:
   the photoelectric conversion layer is disposed between an electrode and the charge capturing unit, and
   a density of the semiconducting carbon nanotubes is higher on the charge capturing unit side than on the electrode side.

* * * * *